United States Patent
Koyama et al.

(10) Patent No.: US 8,830,278 B2
(45) Date of Patent: *Sep. 9, 2014

(54) LIQUID CRYSTAL DISPLAY DEVICE AND METHOD FOR DRIVING THE SAME

(75) Inventors: Jun Koyama, Sagamihara (JP); Hiroyuki Miyake, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 563 days.

This patent is subject to a terminal disclaimer.

(21) Appl. No.: 13/078,204

(22) Filed: Apr. 1, 2011

(65) Prior Publication Data

US 2011/0249037 A1    Oct. 13, 2011

(30) Foreign Application Priority Data

Apr. 9, 2010    (JP) ................... 2010-090934
Apr. 9, 2010    (JP) ................... 2010-090936
May 18, 2010   (JP) ................... 2010-114429
May 18, 2010   (JP) ................... 2010-114431

(51) Int. Cl.
    *G09G 5/10*    (2006.01)
(52) U.S. Cl.
    USPC ................. 345/690; 345/92; 345/100
(58) Field of Classification Search
    USPC ............... 345/87–103, 204–215, 690–699
    See application file for complete search history.

(56) References Cited

U.S. PATENT DOCUMENTS

| | | | |
|---|---|---|---|
| 6,115,017 A * | 9/2000 | Mikami et al. | 345/92 |
| 6,448,951 B1 * | 9/2002 | Sakaguchi et al. | 345/88 |
| 6,882,012 B2 | 4/2005 | Yamazaki et al. | |
| 7,193,593 B2 | 3/2007 | Koyama et al. | |
| 7,224,339 B2 | 5/2007 | Koyama et al. | |
| 7,268,756 B2 | 9/2007 | Koyama et al. | |
| 7,317,438 B2 | 1/2008 | Yamazaki et al. | |
| 7,385,579 B2 | 6/2008 | Satake | |
| 7,425,937 B2 | 9/2008 | Inukai | |

(Continued)

FOREIGN PATENT DOCUMENTS

| | | |
|---|---|---|
| JP | 2006-220685 | 8/2006 |
| JP | 2007-264211 | 10/2007 |
| JP | 2009-042405 | 2/2009 |
| JP | 2009-042405 A | 2/2009 |

OTHER PUBLICATIONS

Baron et al., "36.4: Can Motion Compensation Eliminate Color Breakup of Moving Objects in Field-Sequential Color Displays?" SID Digest '96: SID International Symposium Digest of Technical Papers, 1996, vol. 27, pp. 843-846.

(Continued)

*Primary Examiner* — Dmitriy Bolotin
(74) *Attorney, Agent, or Firm* — Eric J. Robinson; Robinson Intellectual Property Law Office, P.C.

(57) ABSTRACT

In a liquid crystal display device, image signals are concurrently supplied to pixels provided in a plurality of rows among pixels arranged in matrix in a pixel portion where input of image signals is controlled by transistors including amorphous semiconductors or microcrystalline semiconductors in channel formation regions. Thus, the frequency of input of image signals to each pixel can be increased without changing the response speed of the transistors or the like included in the liquid crystal display device.

11 Claims, 24 Drawing Sheets

(56) References Cited

U.S. PATENT DOCUMENTS

| | | | |
|---|---|---|---|
| 7,728,810 B2* | 6/2010 | You et al. | 345/103 |
| 8,426,866 B2* | 4/2013 | Kimura et al. | 257/72 |
| 2002/0018029 A1* | 2/2002 | Koyama | 345/39 |
| 2002/0024485 A1* | 2/2002 | Koyama | 345/87 |
| 2004/0095305 A1* | 5/2004 | Kimura et al. | 345/92 |
| 2004/0222955 A1* | 11/2004 | Koyama | 345/87 |
| 2005/0012097 A1 | 1/2005 | Yamazaki | |
| 2007/0057904 A1* | 3/2007 | Huang et al. | 345/103 |
| 2007/0120810 A1* | 5/2007 | You et al. | 345/103 |
| 2007/0279359 A1* | 12/2007 | Yoshida et al. | 345/89 |
| 2008/0024418 A1* | 1/2008 | Kim | 345/98 |
| 2008/0158137 A1* | 7/2008 | Yoshida | 345/102 |
| 2009/0051674 A1* | 2/2009 | Kimura et al. | 345/204 |
| 2009/0073100 A1* | 3/2009 | Kim et al. | 345/92 |
| 2009/0267878 A1* | 10/2009 | Song et al. | 345/87 |
| 2009/0273555 A1* | 11/2009 | Song et al. | 345/96 |
| 2009/0273557 A1* | 11/2009 | Song et al. | 345/100 |
| 2009/0289964 A1* | 11/2009 | Miyachi | 345/690 |
| 2009/0321737 A1 | 12/2009 | Isa et al. | |
| 2010/0134398 A1* | 6/2010 | Toyota et al. | 345/92 |
| 2010/0134451 A1* | 6/2010 | Cho et al. | 345/205 |
| 2010/0148177 A1 | 6/2010 | Koyama et al. | |
| 2010/0182282 A1 | 7/2010 | Kurokawa et al. | |
| 2010/0225615 A1* | 9/2010 | Kurokawa | 345/175 |
| 2011/0242071 A1 | 10/2011 | Koyama et al. | |
| 2011/0248970 A1 | 10/2011 | Koyama et al. | |
| 2011/0248978 A1 | 10/2011 | Koyama et al. | |

OTHER PUBLICATIONS

Kurita et al., "Evaluation and Improvement of Picture Quality for Moving Images on Field-sequential Color Displays," IDW '00: Proceedings of the 17$^{th}$ International Display Workshops, 2000, pp. 69-72.

Taira et al., "A15" Field-Sequential Display without Color Break-Up using an AFLC Color Shutter, IDW '00 : Proceedings of the 17$^{th}$ International Display Workshops, 2000, pp. 73-76.

Jarvenpaa, "7.2: Measuring Color Breakup of Stationary Images in Field-Sequential-Color Displays," SID Digest '04: SID International Symposium Digest of Technical Papers, 2004, vol. 35, pp. 82-85.

* cited by examiner

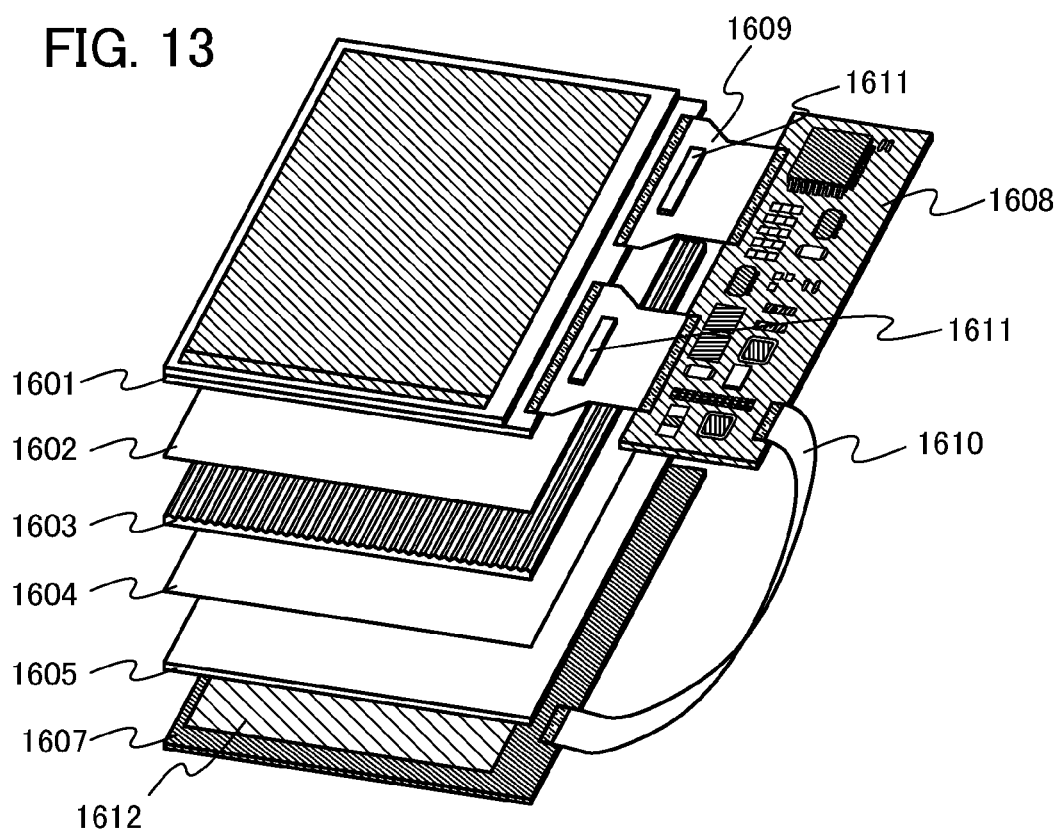

1651
1652
1650

1652

LIQUID CRYSTAL DISPLAY DEVICE AND METHOD FOR DRIVING THE SAME

BACKGROUND OF THE INVENTION

1. Field of the Invention

The present invention relates to liquid crystal display devices and methods for driving the liquid crystal display devices. In particular, the present invention relates to field-sequential liquid crystal display devices and methods for driving the field-sequential liquid crystal display devices.

2. Description of the Related Art

As display methods of liquid crystal display devices, a color filter method and a field sequential method are known. In a color-filter liquid crystal display device, a plurality of subpixels which have color filters for transmitting only light of wavelengths with given colors (e.g., red (R), green (G), and blue (B)) are provided in each pixel. A desired color is expressed by control of transmission of white light in each subpixel and mixture of a plurality of colors in each pixel. In contrast, in a field-sequential liquid crystal display device, a plurality of light sources that emit lights of different colors (e.g., red (R), green (G), and blue (B)) are provided. A desired color is expressed by sequential lighting of the plurality of light sources and control of transmission of lights of different colors in each pixel. In other words, the color filter method is a method by which a desired color is expressed by division of the area of one pixel among lights of given colors, and the field sequential method is a method by which a desired color is expressed by division of a display period among lights of given colors.

The field-sequential liquid crystal display device has the following advantages over the color-filter liquid crystal display device. First, in the field-sequential liquid crystal display device, it is not necessary to provide subpixels in each pixel. Thus, the aperture ratio can be improved or the number of pixels can be increased. Further, in the field-sequential liquid crystal display device, it is not necessary to provide color filters. That is, light loss caused by light absorption in color filters does not occur. Therefore, transmittance can be improved and power consumption can be reduced.

Reference 1 discloses a field-sequential liquid crystal display device. Specifically, Reference 1 discloses a liquid crystal display device in which each pixel includes a transistor for controlling input of an image signal, a signal storage capacitor for holding the image signal, and a transistor for controlling transfer of an electrical charge from the signal storage capacitor to a display pixel capacitor. In the liquid crystal display device with the structure, writing of an image signal to the signal storage capacitor and display based on an electrical charge held in the display pixel capacitor can be performed concurrently.

REFERENCE

Reference 1: Japanese Published Patent Application No. 2009-042405

SUMMARY OF THE INVENTION

In a field-sequential liquid crystal display device, it is necessary to increase the frequency of input of an image signal to each pixel. For example, in a field-sequential liquid crystal display device which includes light sources that emit lights of three colors (red (R), green (G), and blue (B)), it is necessary to triple the frequency of input of an image signal to each pixel at least, as compared to a color-filter liquid crystal display device. Specifically, in the case where frame frequency is 60 Hz, it is necessary to input image signals to each pixel 60 times for one second in the color-filter liquid crystal display device; in contrast, it is necessary to input image signals to each pixel 180 times for one second in the field-sequential liquid crystal display device which includes the light sources that emit lights of the three colors (red (R), green (G), and blue (B)).

Note that with the increase in the frequency of input of image signals, an element provided in each pixel should have high response speed. Specifically, a transistor provided in each pixel should have higher mobility, for example. However, it is not easy to improve the characteristics of the transistor or the like.

Therefore, an object of one embodiment of the present invention is to increase the frequency of input of image signals.

The object can be achieved by concurrent supply of image signals to pixels provided in a plurality of rows among pixels arranged in matrix in a pixel portion of a liquid crystal display device.

In other words, one embodiment of the present invention is a liquid crystal display device which includes a first signal line, a second signal line, a first scan line, a second scan line, a third scan line, a fourth scan line, a first pixel, a second pixel, a first shift register electrically connected to the first scan line and the third scan line, which has a function of supplying a selection signal, and a second shift register electrically connected to the second scan line and the fourth scan line, which has a function of supplying a selection signal. The first pixel includes a first transistor, a second transistor, and a first liquid crystal element. A gate of the first transistor is electrically connected to the first scan line. One of a source and a drain of the first transistor is electrically connected to the first signal line. A gate of the second transistor is electrically connected to the second scan line. One of a source and a drain of the second transistor is electrically connected to the second signal line. One electrode of the first liquid crystal element is electrically connected to the other of the source and the drain of the first transistor and the other of the source and the drain of the second transistor. The second pixel includes a third transistor, a fourth transistor, and a second liquid crystal element. A gate of the third transistor is electrically connected to the third scan line. One of a source and a drain of the third transistor is electrically connected to the first signal line. A gate of the fourth transistor is electrically connected to the fourth scan line. One of a source and a drain of the fourth transistor is electrically connected to the second signal line. One electrode of the second liquid crystal element is electrically connected to the other of the source and the drain of the third transistor and the other of the source and the drain of the fourth transistor. Channel formation regions of the first to fourth transistors include amorphous semiconductors or microcrystalline semiconductors. Further, from the first signal line, a first image signal is supplied in a horizontal scan period included in a first sampling period, and a second image signal is supplied in a horizontal scan period included in a second sampling period. From the second signal line, a third image signal is supplied in the horizontal scan period included in the first sampling period, and a fourth image signal is supplied in the horizontal scan period included in the second sampling period. Additionally, in the horizontal scan period included in the first sampling period, a selection signal is supplied to the first scan line and the fourth scan line, and a non-selection signal is supplied to the second scan line and the third scan line. In the horizontal scan period included in the second sampling period, a selection signal is supplied to the second scan line and the third scan line, and a non-selection signal is supplied to the first scan line and the fourth scan line.

One embodiment of the present invention is a liquid crystal display device which includes a first signal line, a second signal line, a third signal line, a first scan line, a second scan line, a third scan line, a fourth scan line, a fifth scan line, a sixth scan line, a seventh scan line, an eighth scan line, a ninth scan line, a first pixel, a second pixel, a third pixel, a first shift register electrically connected to the first scan line, the fourth scan line, and the seventh scan line, which has a function of supplying a selection signal, a second shift register electrically connected to the second scan line, the fifth scan line, and the eighth scan line, which has a function of supplying a selection signal, and a third shift register electrically connected to the third scan line, the sixth scan line, and the ninth scan line, which has a function of supplying a selection signal. The first pixel includes a first transistor, a second transistor, a third transistor, and a first liquid crystal element. A gate of the first transistor is electrically connected to the first scan line. One of a source and a drain of the first transistor is electrically connected to the first signal line. A gate of the second transistor is electrically connected to the second scan line. One of a source and a drain of the second transistor is electrically connected to the second signal line. A gate of the third transistor is electrically connected to the third scan line. One of a source and a drain of the third transistor is electrically connected to the third signal line. One electrode of the first liquid crystal element is electrically connected to the other of the source and the drain of the first transistor, the other of the source and the drain of the second transistor, and the other of the source and the drain of the third transistor. The second pixel includes a fourth transistor, a fifth transistor, a sixth transistor, and a second liquid crystal element. A gate of the fourth transistor is electrically connected to the fourth scan line. One of a source and a drain of the fourth transistor is electrically connected to the first signal line. A gate of the fifth transistor is electrically connected to the fifth scan line. One of a source and a drain of the fifth transistor is electrically connected to the second signal line. A gate of the sixth transistor is electrically connected to the sixth scan line. One of a source and a drain of the sixth transistor is electrically connected to the third signal line. One electrode of the second liquid crystal element is electrically connected to the other of the source and the drain of the fourth transistor, the other of the source and the drain of the fifth transistor, and the other of the source and the drain of the sixth transistor. The third pixel includes a seventh transistor, an eighth transistor, a ninth transistor, and a third liquid crystal element. A gate of the seventh transistor is electrically connected to the seventh scan line. One of a source and a drain of the seventh transistor is electrically connected to the first signal line. A gate of the eighth transistor is electrically connected to the eighth scan line. One of a source and a drain of the eighth transistor is electrically connected to the second signal line. A gate of the ninth transistor is electrically connected to the ninth scan line. One of a source and a drain of the ninth transistor is electrically connected to the third signal line. One electrode of the third liquid crystal element is electrically connected to the other of the source and the drain of the seventh transistor, the other of the source and the drain of the eighth transistor, and the other of the source and the drain of the ninth transistor. Channel formation regions of the first to ninth transistors include amorphous semiconductors or microcrystalline semiconductors. Further, from the first signal line, a first image signal is supplied in a horizontal scan period included in a first sampling period, a second image signal is supplied in a horizontal scan period included in a second sampling period, and a third image signal is supplied in a horizontal scan period included in a third sampling period. From the second signal line, a fourth image signal is supplied in the horizontal scan period included in the first sampling period, a fifth image signal is supplied in the horizontal scan period included in the second sampling period, and a sixth image signal is supplied in the horizontal scan period included in the third sampling period. From the third signal line, a seventh image signal is supplied in the horizontal scan period included in the first sampling period, an eighth image signal is supplied in the horizontal scan period included in the second sampling period, and a ninth image signal is supplied in the horizontal scan period included in the third sampling period. Additionally, in the horizontal scan period included in the first sampling period, a selection signal is supplied to the first scan line, the fifth scan line, and the ninth scan line, and a non-selection signal is supplied to the second scan line, the third scan line, the fourth scan line, the sixth scan line, the seventh scan line, and the eighth scan line. In the horizontal scan period included in the second sampling period, a selection signal is supplied to the third scan line, the fourth scan line, and the eighth scan line, and a non-selection signal is supplied to the first scan line, the second scan line, the fifth scan line, the sixth scan line, the seventh scan line, and the ninth scan line. In the horizontal scan period included in the third sampling period, a selection signal is supplied to the second scan line, the sixth scan line, and the seventh scan line, and a non-selection signal is supplied to the first scan line, the third scan line, the fourth scan line, the fifth scan line, the eighth scan line, and the ninth scan line.

One embodiment of the present invention is a liquid crystal display device which includes a first signal line, a second signal line, a first scan line, a second scan line, a first pixel, a second pixel, a first shift register electrically connected to the first scan line, which has a function of supplying a selection signal, and a second shift register electrically connected to the second scan line, which has a function of supplying a selection signal. The first pixel includes a first transistor and a first liquid crystal element. A gate of the first transistor is electrically connected to the first scan line. One of a source and a drain of the first transistor is electrically connected to the first signal line. One electrode of the first liquid crystal element is electrically connected to the other of the source and the drain of the first transistor. The second pixel includes a second transistor and a second liquid crystal element. A gate of the second transistor is electrically connected to the second scan line. One of a source and a drain of the second transistor is electrically connected to the second signal line. One electrode of the second liquid crystal element is electrically connected to the other of the source and the drain of the second transistor. Channel formation regions of the first and second transistors include amorphous semiconductors or microcrystalline semiconductors. Further, from the first signal line, a first image signal is supplied in a horizontal scan period included in a first sampling period, and a second image signal is supplied in a horizontal scan period included in a second sampling period. From the second signal line, a third image signal is supplied in the horizontal scan period included in the first sampling period, and a fourth image signal is supplied in the horizontal scan period included in the second sampling period. Additionally, in the horizontal scan period included in the first sampling period, a selection signal is supplied to the first scan line and the second scan line. In the horizontal scan period included in the second sampling period, a selection signal is supplied to the first scan line and the second scan line.

Further, in the liquid crystal display device according to one embodiment of the present invention, a transistor which includes an amorphous semiconductor or a microcrystalline semiconductor of silicon, germanium, or the like in a channel formation region is used. In a liquid crystal display device which includes a transistor including an amorphous semiconductor or a microcrystalline semiconductor in a pixel portion, a glass substrate of the fifth generation (1300 mm by 1100 mm) or later can be used. Thus, such a liquid crystal display device has advantages of high productivity and low cost.

Specifically, in the liquid crystal display device according to one embodiment of the present invention, a transistor including an amorphous semiconductor or a microcrystalline semiconductor in a channel formation region can be used in the pixel portion and a transistor including a single crystal semiconductor in a channel formation region can be used in a driver circuit.

Note that a microcrystalline semiconductor is a semiconductor having an intermediate structure between amorphous and crystalline structures (including a single crystal structure and a polycrystalline structure). The microcrystalline semiconductor is a semiconductor having a third state that is stable in terms of free energy and is a crystalline semiconductor having short-range order and lattice distortion, in which columnar or needle-like crystals having a grain size of 2 to 200 nm, preferably 10 to 80 nm, more preferably 20 to 50 nm have grown in a direction normal to a substrate surface. Therefore, a crystal grain boundary is formed at the interface of the columnar or needle-like crystal grains in some cases.

A transistor including a microcrystalline semiconductor in a channel formation region has advantages that mobility is higher than that of a transistor including an amorphous semiconductor in a channel formation region and that a pixel portion and some of peripheral driver circuits of a liquid crystal display device can be formed over one substrate.

Thus, in the liquid crystal display device according to one embodiment of the present invention, with the use of a transistor including a microcrystalline semiconductor in a channel formation region, the pixel portion and some of the driver circuits can be formed over one substrate.

When some of the driver circuits are formed over the same substrate as the pixel portion, the number of components such as external driver circuits is reduced. Thus, it is possible not only to downsize the liquid crystal display device but also to reduce cost by the decrease in the number of assembly steps and inspection steps. Further, the number of terminals which connect the driver circuits and the pixel portion to each other can be reduced. Therefore, it is possible to prevent the decrease in the yield caused by poor connection between the driver circuits and the pixel portion and the decrease in the reliability caused by low mechanical strength at a connection point.

In the liquid crystal display device according to one embodiment of the present invention, image signals can be concurrently supplied to pixels provided in a plurality of rows among pixels arranged in matrix. Thus, without any change in the response speed of a transistor or the like included in the liquid crystal display device, the frequency of input of an image signal to each pixel can be increased.

BRIEF DESCRIPTION OF THE DRAWINGS

In the accompanying drawings:

FIG. 13 is a perspective view illustrating a specific example of a liquid crystal display device;

DETAILED DESCRIPTION OF THE INVENTION

Embodiments of the present invention will be described below in detail with reference to the drawings. Note that the present invention is not limited to the following description. It will be readily appreciated by those skilled in the art that modes and details of the present invention can be changed in various ways without departing from the spirit and scope of the present invention. Therefore, the present invention should not be construed as being limited to the following description of the embodiments.

Embodiment 1

In this embodiment, an example of a field-sequential liquid crystal display device is described with reference to FIGS. 1A and 1B, FIG. 2, FIG. 3, FIGS. 4A and 4B, and FIG. 5.

<Structure Example of Liquid Crystal Display Device>

Figure 1A:
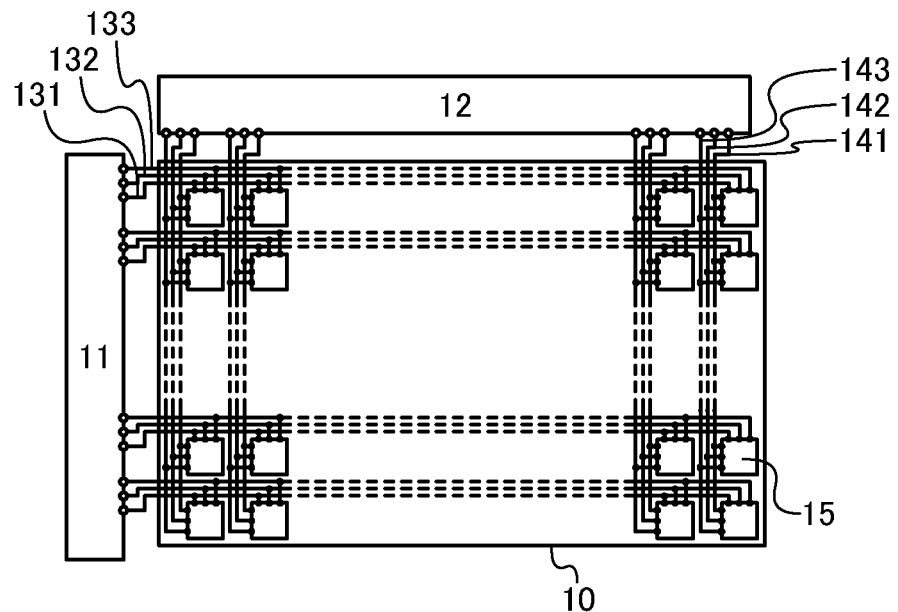
FIG. 1A illustrates a structure example of a liquid crystal display device.

FIG. 1A illustrates a structure example of a liquid crystal display device. The liquid crystal display device illustrated in FIG. 1A includes a pixel portion 10; a scan line driver circuit 11; a signal line driver circuit 12; 3n (n is a natural number that is 2 or more) scan lines 131, 3n scan lines 132, and 3n scan lines 133 which are arranged parallel or almost parallel to each other and whose potentials are controlled by the scan line driver circuit 11; and m (m is a natural number that is 2 or more) signal lines 141, m signal lines 142, and m signal lines 143 which are arranged parallel or almost parallel to each other and whose potentials are controlled by the signal line driver circuit 12.

The pixel portion 10 includes a plurality of pixels 15 arranged in matrix (3n rows by m columns). Note that each of the scan lines 131, 132, and 133 is electrically connected to m pixels 15 provided in a given row among the plurality of pixels 15 arranged in matrix (the 3n rows by the m columns). Further, each of the signal lines 141, 142, and 143 is electrically connected to 3n pixels 15 provided in a given column among the plurality of pixels 15 arranged in matrix (the 3n rows by the m columns).

Note that start signals (GSP1 to GSP3) for the scan line driver circuit, a clock signal (GCK) for the scan line driver circuit, and drive power supply potentials such as a high power supply potential ($V_{DD}$) and a low power supply potential ($V_{SS}$) are input to the scan line driver circuit 11 from the outside. Further, signals such as a start signal (SSP) for the signal line driver circuit, a clock signal (SCK) for the signal line driver circuit, and image signals (DATA1 to DATA3), and power supply potentials such as a high power supply potential and a low power supply potential are input to the signal line driver circuit 12 from the outside.

Figure 1B:
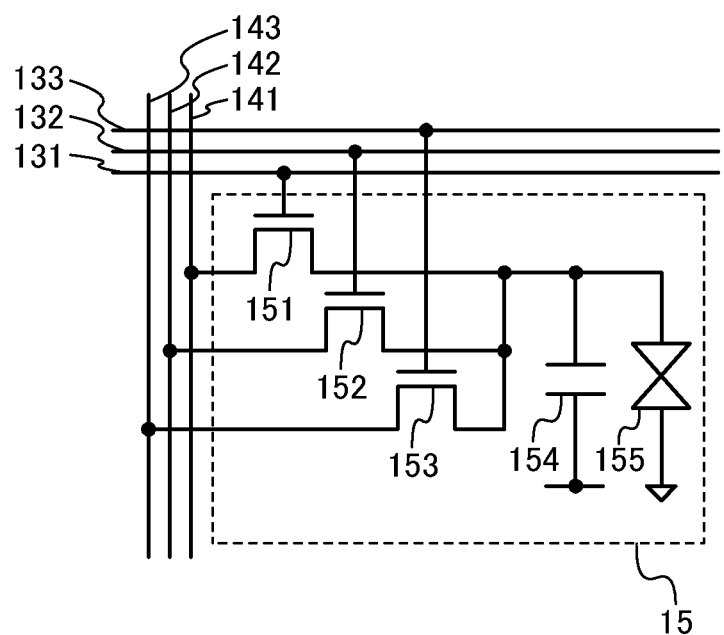
FIG. 1B illustrates a structure example of a pixel.

FIG. 1B illustrates an example of the circuit structure of the pixel 15. The pixel 15 illustrated in FIG. 1B includes a transistor 151, a transistor 152, a transistor 153, a capacitor 154, and a liquid crystal element 155. A gate of the transistor 151 is electrically connected to the scan line 131. One of a source and a drain of the transistor 151 is electrically connected to the signal line 141. A gate of the transistor 152 is electrically connected to the scan line 132. One of a source and a drain of the transistor 152 is electrically connected to the signal line 142. A gate of the transistor 153 is electrically connected to the scan line 133. One of a source and a drain of the transistor 153 is electrically connected to the signal line 143. One electrode of the capacitor 154 is electrically connected to the other of the source and the drain of the transistor 151, the other of the source and the drain of the transistor 152, and the other of the source and the drain of the transistor 153. The other electrode of the capacitor 154 is electrically connected to a wiring for supplying a capacitor potential. One electrode of the liquid crystal element 155 is electrically connected to the other of the source and the drain of the transistor 151, the other of the source and the drain of the transistor 152, the other of the source and the drain of the transistor 153, and one electrode of the capacitor 154. The other electrode of the liquid crystal element 155 is electrically connected to a wiring for supplying a counter potential.

<Structure Example of Scan Line Driver Circuit 11>

Figure 2:
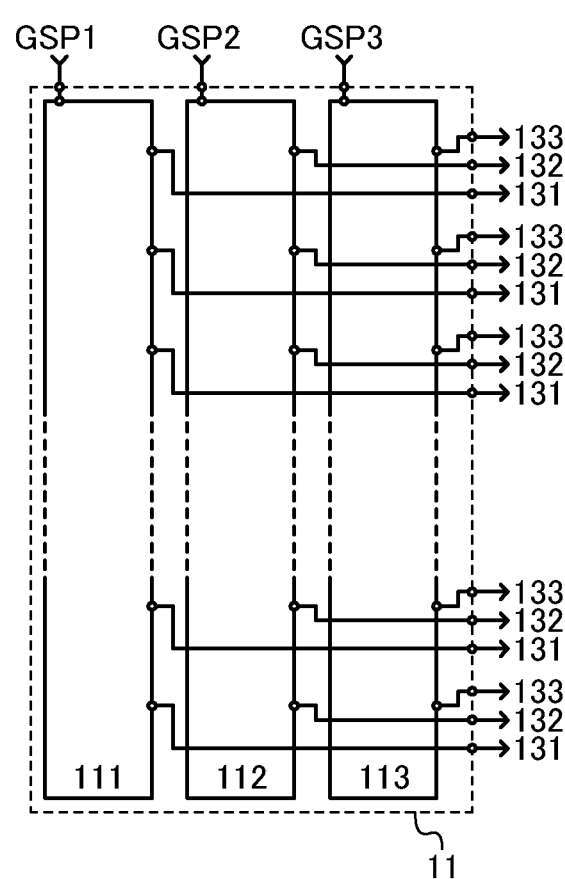
FIG. 2 illustrates a structure example of a scan line driver circuit.

FIG. 2 illustrates a structure example of the scan line driver circuit 11 included in the liquid crystal display device illustrated in FIG. 1A. The scan line driver circuit 11 illustrated in FIG. 2 includes three shift registers 111 to 113 each including 3n output terminals. Note that each output terminal of the shift register 111 is electrically connected to one of the 3n scan lines 131 provided in the pixel portion 10. Each output terminal of the shift register 112 is electrically connected to one of the 3n scan lines 132 provided in the pixel portion 10. Each output terminal of the shift register 113 is electrically connected to one of the 3n scan lines 133 provided in the pixel portion 10. In other words, the shift register 111 drives the scan lines 131; the shift register 112 drives the scan lines 132; and the shift register 113 drives the scan lines 133. Specifically, the shift register 111 has a function of sequentially supplying selection signals (sequentially selecting the scan lines 131 every half the cycle of the clock signal (GCK) for the scan line driver circuit) from the scan line 131 provided in a first row with the first start signal (GSP1) for the scan line driver circuit that is input from the outside served as a trigger; the shift register 112 has a function of sequentially supplying selection signals from the scan line 132 provided in the first row with the second start signal (GSP2) for the scan line driver circuit that is input from the outside served as a trigger; and the shift register 113 has a function of sequentially supplying selection signals from the scan line 133 provided in the first row with the third start signal (GSP3) for the scan line driver circuit that is input from the outside served as a trigger.

<Operation Example of Scan Line Driver Circuit 11>

Figure 3:
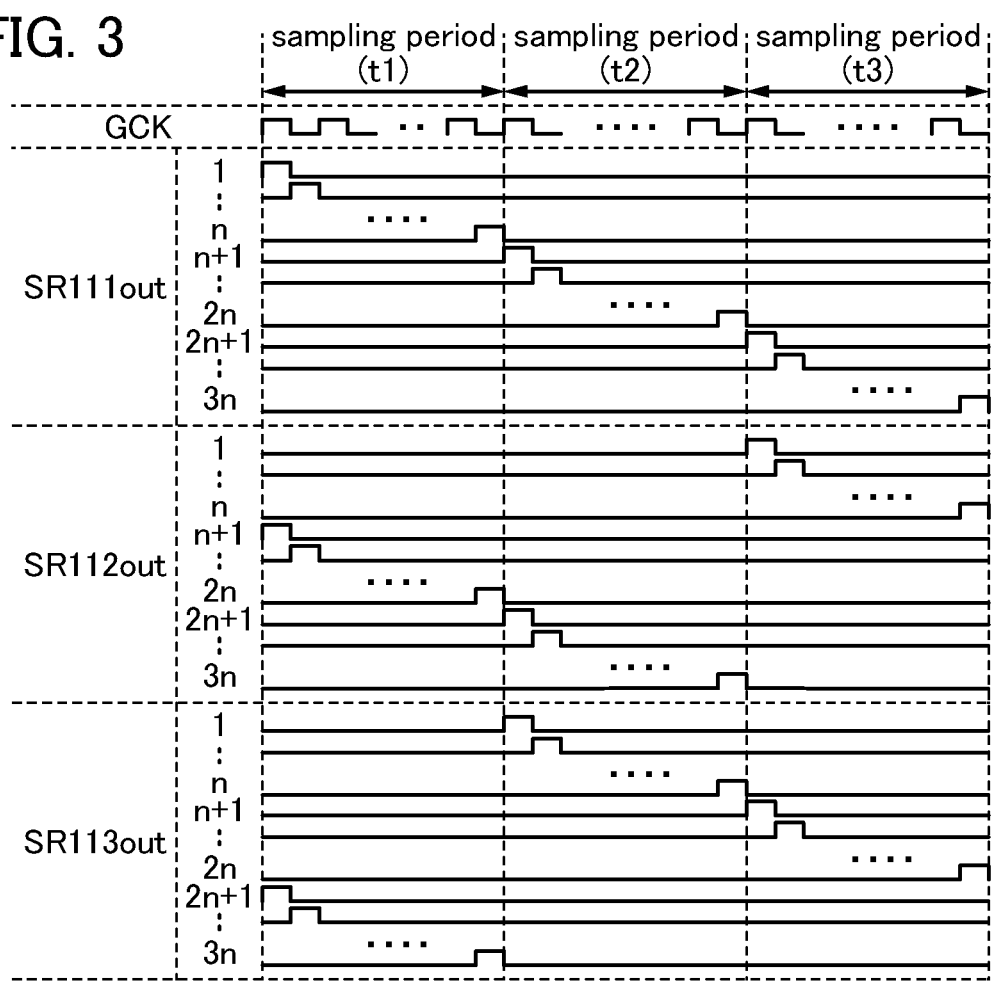
FIG. 3 illustrates output signals of shift registers.

An operation example of the scan line driver circuit 11 is described with reference to FIG. 3. Note that FIG. 3 illustrates the clock signal (GCK) for the scan line driver circuit, signals (SR111out) output from the 3n output terminals of the shift register 111, signals (SR112out) output from the 3n output terminals of the shift register 112, and signals (SR113out) output from the 3n output terminals of the shift register 113. Here, a sampling period means a period required to input any image signals to all the rows (from the first row to the 3n-th row).

In a sampling period (t1), high-level potentials are sequentially shifted from the scan line 131 provided in the first row to the scan line 131 provided in an n-th row every half the cycle of the clock signal (horizontal scan period) in the shift register 111; high-level potentials are sequentially shifted from the scan line 132 provided in an (n+1)th row to the scan line 132 provided in a 2n-th row every half the cycle of the clock signal (horizontal scan period) in the shift register 112; and high-level potentials are sequentially shifted from the scan line 133 provided in a (2n+1)th row to the scan line 133 provided in the 3n-th row every half the cycle of the clock signal (horizontal scan period) in the shift register 113. Therefore, in the scan line driver circuit 11, m pixels 15 provided in the first row to m pixels 15 provided in the n-th row are sequentially selected through the scan lines 131; m pixels 15 provided in the (n+1)th row to m pixels 15 provided in the 2n-th row are sequentially selected through the scan lines 132; and m pixels 15 provided in the (2n+1)th row to m pixels 15 provided in the 3n-th row are sequentially selected through the scan lines 133. In other words, in the scan line driver circuit 11, selection signals can be supplied to 3m pixels 15 provided in different three rows every horizontal scan period.

In a sampling period (t2), although output signals of the shift registers 111 to 113 are different from those in the sampling period (t1), the following operation is the same as that in the sampling period (t1): one of the shift registers 111 to 113 (the shift register 113 in the sampling period (t2)) sequentially selects the m pixels 15 provided in the first row to the m pixels 15 provided in the n-th row; another one of the shift registers 111 to 113 that is different from the one of the shift registers 111 to 113 (the shift register 111 in the sampling period (t2)) sequentially selects the m pixels 15 provided in the (n+1)th row to the m pixels 15 provided in the 2n-th row; and the other of the shift registers 111 to 113 that is different from the two of the shift registers 111 to 113 (the shift register 112 in the sampling period (t2)) sequentially selects the m pixels 15 provided in the (2n+1)th row to the m pixels 15 provided in the 3n-th row. In other words, in the scan line driver circuit 11, as in the sampling period (t1), selection signals can be supplied to 3m pixels 15 provided in given three rows every horizontal scan period.

<Structure Example of Signal Line Driver Circuit 12>

Figure 4A:
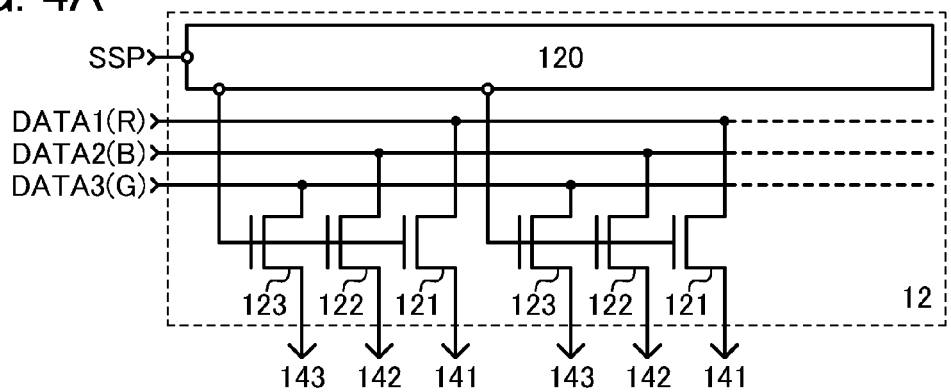
FIG. 4A illustrates a structure example of a signal line driver circuit.

FIG. 4A illustrates a structure example of the signal line driver circuit 12 included in the liquid crystal display device illustrated in FIG. 1A. The signal line driver circuit 12 illustrated in FIG. 4A includes a shift register 120 having m output terminals, m transistors 121, m transistors 122, and m transistors 123. Note that a gate of the transistor 121 is electrically connected to a j-th output terminal (j is a natural number that is 1 or more and m or less) of the shift register 120; one of a source and a drain of the transistor 121 is electrically connected to a wiring for supplying the first image signal (DATA1); and the other of the source and the drain of the transistor 121 is electrically connected to the signal line 141 provided in a j-th column in the pixel portion 10. In addition, a gate of the transistor 122 is electrically connected to the j-th output terminal of the shift register 120; one of a source and a drain of the transistor 122 is electrically connected to a wiring for supplying the second image signal (DATA2); and the other of the source and the drain of the transistor 122 is electrically connected to the signal line 142 provided in the j-th column in the pixel portion 10. Further, a gate of the transistor 123 is electrically connected to the j-th output terminal of the shift register 120; one of a source and a drain of the transistor 123 is electrically connected to a wiring for supplying the third image signal (DATA3); and the other of the source and the drain of the transistor 123 is electrically connected to the signal line 143 provided in the j-th column in the pixel portion 10.

Note that here, a red (R) image signal (an image signal for controlling transmission of red (R) light) is supplied to the signal line 141 as the first image signal (DATA1); a blue (B) image signal (an image signal for controlling transmission of blue (B) light) is supplied to the signal line 142 as the second image signal (DATA2); and a green (G) image signal (an image signal for controlling transmission of green (G) light) is supplied to the signal line 143 as the third image signal (DATA3).

<Structure Example of Backlight>

Figure 4B:
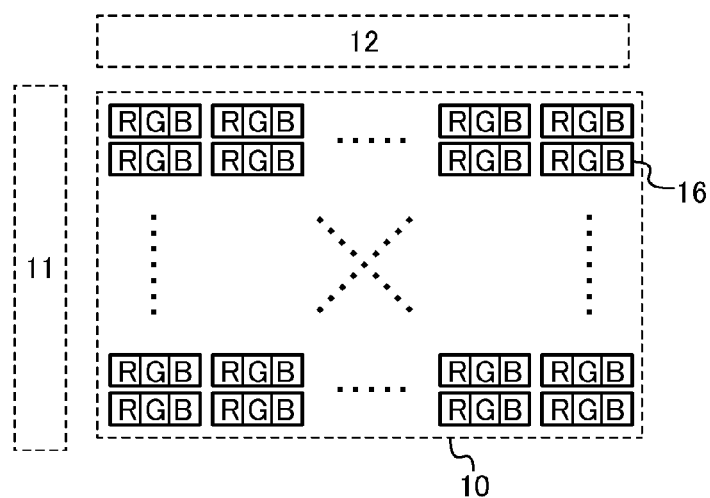
FIG. 4B illustrates a structure example of a backlight.

FIG. 4B illustrates a structure example of a backlight provided behind the pixel portion 10 in the liquid crystal display device illustrated in FIG. 1A. The backlight illustrated in FIG. 4B includes a plurality of backlight units 16 each including light sources of three colors of red (R), green (G), and blue (B). Note that the plurality of backlight units 16 are arranged in matrix and lighting of the backlight units 16 can be controlled every given region. Here, a backlight unit group is provided at least every k rows by m columns (here, k is n/4) as the backlight for the plurality of pixels 15 provided in the 3n rows by the m columns. Lighting of the backlight unit groups can be controlled independently. In other words, the backlight can include at least a backlight unit group for the first to k-th rows to a backlight unit group for a (3n−k+1)th row to the 3n-th row. Lighting of the backlight unit groups can be controlled independently.

<Operation Example of Liquid Crystal Display Device>

Figure 5:
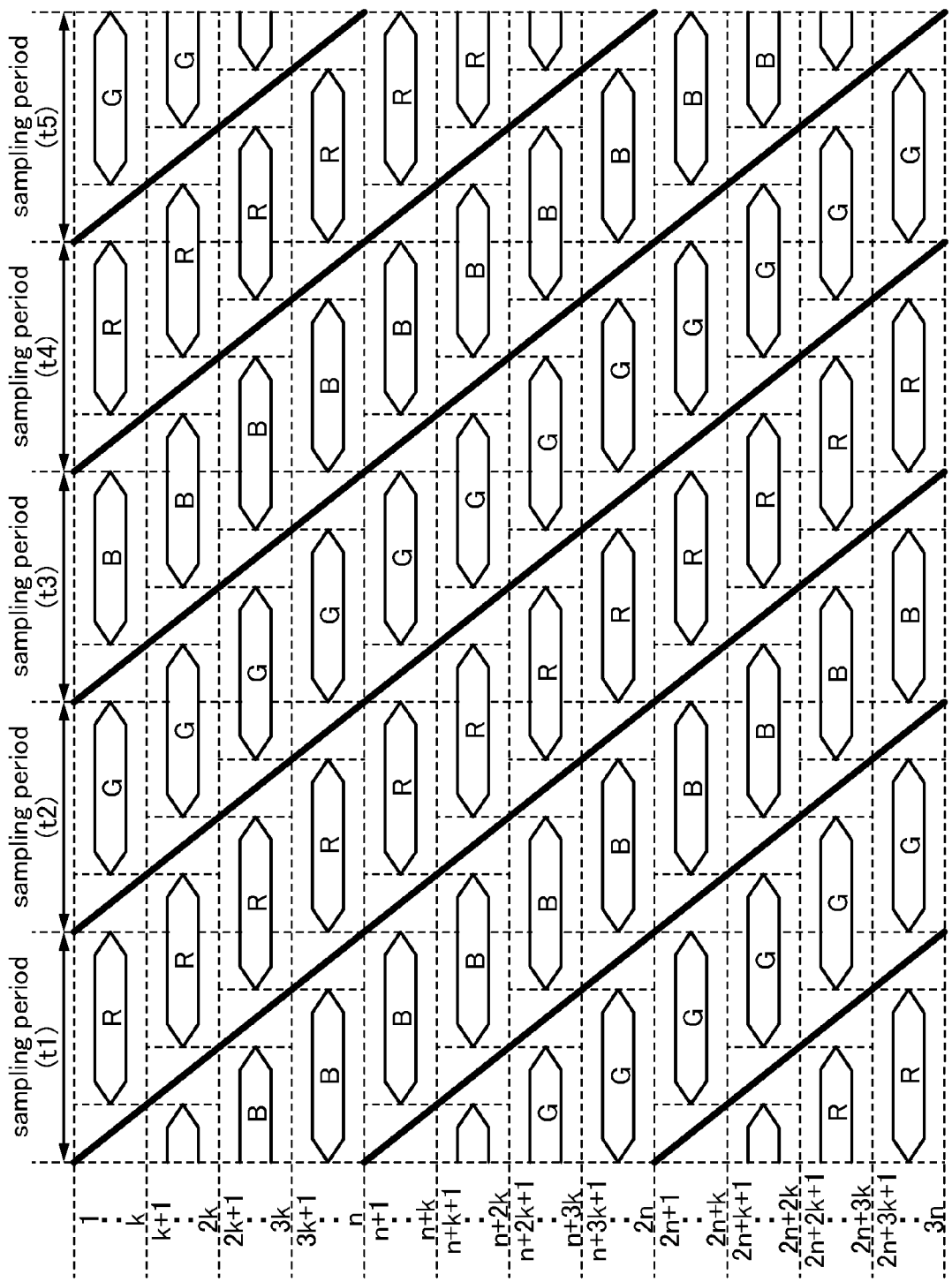
FIG. 5 illustrates an operation example of a liquid crystal display device.

FIG. 5 illustrates timing of when the backlight unit group for the first to k-th rows to the backlight unit group for the (3n−k+1)th to 3n-th rows that are included in the backlight are lit in the liquid crystal display device and timing of when image signals are input to m pixels provided in the first row to m pixels provided in an 3n-th row in the pixel portion 10. Specifically, in FIG. 5, 1 to 3n indicate the number of rows and solid lines indicate timing of when image signals are input in the rows. In the liquid crystal display device, in the sampling period (t1), the m pixels 15 provided in the first row to the m pixels 15 provided in the n-th row are sequentially selected; the m pixels 15 provided in the (n+1)th row to the m pixels 15 provided in the 2n-th row are sequentially selected; and the m pixels 15 provided in the (2n+1)th row to the m pixels 15 provided in the 3n-th row are sequentially selected. Thus, the image signal can be input to each pixel. Specifically, in the liquid crystal display device, in the sampling period (t1), the red (R) image signals can be sequentially input to the pixels through the signal lines 141 when the transistors 151 included in the m pixels 15 provided in the first row to the transistors 151 included in the m pixels 15 provided in the n-th row are sequentially turned on through the scan lines 131; the blue (B) image signals can be sequentially input to the pixels through the signal lines 142 when the transistors 152 included in the m pixels 15 provided in the (n+1)th row to the transistors 152 included in the m pixels 15 provided in the 2n-th row are sequentially turned on through the scan lines 132; and the green (G) image signals can be sequentially input to the pixels through the signal lines 143 when the transistors 153 included in the m pixels 15 provided in the (2n+1)th row to the transistors 153 included in the m pixels 15 provided in the 3n-th row are sequentially turned on through the scan lines 133.

Further, in the liquid crystal display device, in the sampling period (t1), red (R) light is emitted from the backlight unit group for the first to k-th rows after the red (R) image signals are input to the m pixels 15 provided in the first row to the m pixels 15 provided in the k-th row; blue (B) light is emitted from the backlight unit group for the (n+1)th to (n+k)th rows after the blue (B) image signals are input to the m pixels 15 provided in the (n+1)th row to the m pixels 15 provided in the (n+k)th row; and green (G) light is emitted from the backlight unit group for the (2n+1)th to (2n+k)th rows after the green (G) image signals are input to the m pixels 15 provided in the (2n+1)th row to the m pixels 15 provided in the (2n+k)th row. In other words, in the liquid crystal display device, a selection signal and light of a given color can be supplied concurrently every region (the first to n-th rows, the (n+1)th to 2n-th rows, and the (2n+1) to 3n-th rows).

<Liquid Crystal Display Device Disclosed in This Specification>

In the liquid crystal display device disclosed in this specification, image signals can be concurrently supplied to pixels provided in a plurality of rows among pixels arranged in matrix. Thus, without any change in the response speed of a transistor or the like included in the liquid crystal display device, the frequency of input of an image signal to each pixel can be increased. Specifically, in the liquid crystal display device, without any change in the clock frequency or the like of the scan line driver circuit, the frequency of input of an image signal to each pixel can be triple. In other words, the liquid crystal display device is suitable for a field-sequential liquid crystal display device or a liquid crystal display device with high frame rate driving.

The reasons why the liquid crystal display device disclosed in this specification is preferably used as a field-sequential liquid crystal display device are as follows. As described above, in the field-sequential liquid crystal display device, a display period is divided among lights of given colors. Thus, display viewed by a user might be changed (deviated) from display based on original display data (such a phenomenon is also referred to as color break or color breakup) due to lack of given display data that is caused by block of display in a short time (e.g., blink of the user). Here, the increase in the frame frequency is effective in suppressing color break. On the other hand, in order to display images by a field sequential method, it is necessary to input an image signal to each pixel with frequency which is higher than the frame frequency. Therefore, in the case where images are displayed in a conventional liquid crystal display device by a field sequential method and high frame rate driving, extremely high performance (extremely high response speed) of an element included in the liquid crystal display device is needed. In contrast, in the liquid crystal display device disclosed in this specification, the frequency of input an image signal to each pixel can be increased without being limited by characteristics of an element. Thus, color break can be easily suppressed in the field-sequential liquid crystal display device.

Further, in the case where images are displayed by a field sequential method, lights of different colors are preferably supplied to regions as illustrated in FIG. 5 for the following reasons. In the case where lights of the same color are supplied to the whole screen, only color data on a given color exists in a pixel portion in a given moment. Thus, lack of display data in a given period that is caused by blink of a user or the like corresponds to lack of given color data. In contrast, in the case where lights of different colors are supplied to regions, color data on the colors exists in the pixel portion in a given moment. Therefore, lack of display data in a given period that is caused by blink of a user or the like does not correspond to lack of given color data. That is, when lights of different colors are supplied to different regions, color break can be suppressed. Further, in the case where backlight unit groups are lit as illustrated in FIG. 5, the adjacent backlight unit groups do not emit lights of different colors. Specifically, in the sampling period (t1), when the backlight unit group for the (n+1)th to (n+k)th rows emits blue (B) light after the blue (B) image signals are input to the m pixels 15 in the (n+1)th row to the m pixels 15 in the (n+k)th row, blue (B) light is emitted or emission itself is not performed (neither red (R) light nor green (G) light is emitted) for a backlight unit group in a (3k+1)th row to the n-th row and a backlight unit group for an (n+k+1)th to (n+2k)th rows. Thus, the probability of transmission of light of a color different from a given color through a pixel to which image data on the given color is input can be reduced.

<Modification Example>

A liquid crystal display device with the above structure is one embodiment of the present invention, and the present invention includes a liquid crystal display device which is different from the aforementioned liquid crystal display device.

For example, the liquid crystal display device has a structure where image signals are concurrently supplied to 3m pixels provided in given three rows in the pixel portion 10 in the same period; however, the structure of a liquid crystal display device in the present invention is not limited to such a structure. In other words, the liquid crystal display device in the present invention can have a structure where image signals are concurrently supplied to a plurality of pixels provided in plural given rows in the pixel portion 10 in the same period. Note that it is obvious that in the case where the number of rows is changed, the number of rows and the number of shift registers or the like should be the same.

In addition, the liquid crystal display device has a structure where image signals are concurrently supplied to pixels provided in given three rows arranged at regular intervals (the interval between rows supplied with image signals is n rows of pixels) in the same period; however, the structure of the liquid crystal display device in the present invention is not limited to such a structure. In other words, the liquid crystal display device in the present invention can have a structure where image signals are concurrently supplied to pixels provided in given three rows which are not arranged at regular intervals in the same period. Specifically, the liquid crystal display device in the present invention can have a structure where image signals are concurrently supplied to m pixels provided in the first row, m pixels provided in an (a+1)th row (a is a natural number), and m pixels provided in an (a+b+1)th row (b is a natural number which is different from a) in the same period.

Further, in the liquid crystal display device, the scan line driver circuit includes shift registers; however, the shift registers can be replaced with circuits having similar functions. For example, the shift registers can be replaced with decoders.

Further, the liquid crystal display device has a structure where light sources that emit lights of three colors of red (R), green (G), and blue (B) are used as a plurality of light sources; however, the structure of the liquid crystal display device in the present invention is not limited to such a structure. In other words, in the liquid crystal display device in the present invention, light sources that emit lights of given colors can be used in combination. For example, light sources that emit lights of four colors of red (R), green (G), blue (B), and white (W) can be used in combination or light sources that emit lights of three colors of cyan, magenta, and yellow can be used in combination. Further, light sources that emit lights of six colors of pale red (R), pale green (G), pale blue (B), deep red (R), deep green (G), and deep blue (B) can be used in combination or light sources that emit lights of six colors of red (R), green (G), blue (B), cyan, magenta, and yellow can be used in combination. In this manner, with a combination of light sources that emit lights of a wider variety of colors, the color gamut of the liquid crystal display device can be increased, so that image quality can be improved.

Further, the liquid crystal display device includes a capacitor for holding voltage applied to a liquid crystal element (see FIG. 1B); however, it is possible not to provide the capacitor.

Furthermore, the liquid crystal display device has a structure where light sources of three colors of red (R), green (G), and blue (B) are arranged laterally in a linear manner as a backlight unit (see FIG. 4B); however, the structure of the backlight unit is not limited to such a structure. For example, the light sources of the three colors may be arranged in triangle; the light sources of the three colors may be arranged longitudinally in a linear manner; or a light source of a red (R) color, a light source of a green (G) color, and a light source of a blue (B) color may be separately provided. Moreover, the liquid crystal display device includes a direct-lit backlight as the backlight (see FIG. 4B); however, an edge-lit backlight can be used as the backlight.

Embodiment 2

In this embodiment, an example of a field-sequential liquid crystal display device with a structure which is different from that in Embodiment 1 is described with reference to FIGS. 6A to 6D, FIGS. 7A and 7B, and FIG. 8.

<Structure Example of Liquid Crystal Display Device>

Figure 6A:
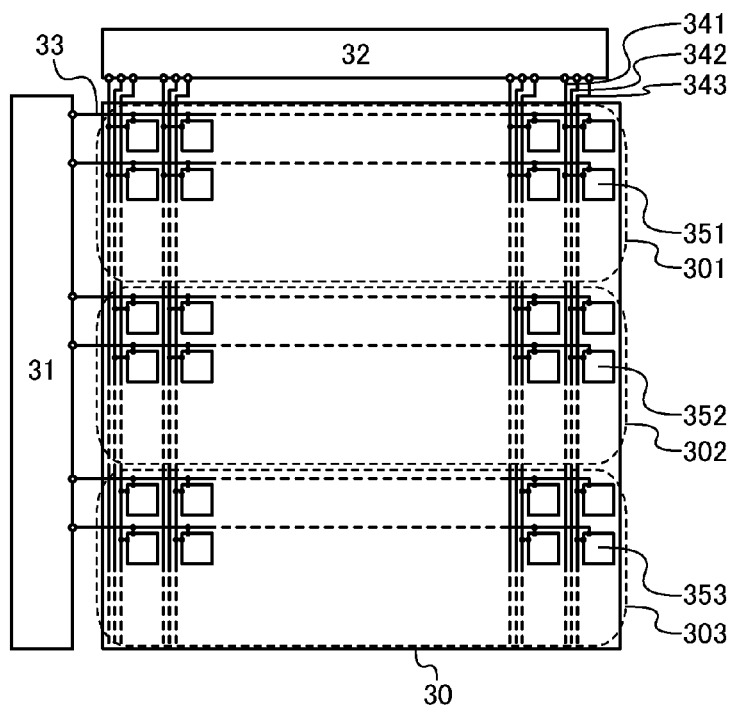
FIG. 6A illustrates a structure example of a liquid crystal display device.

FIG. 6A illustrates a structure example of a liquid crystal display device. The liquid crystal display device illustrated in FIG. 6A includes a pixel portion 30; a scan line driver circuit 31; a signal line driver circuit 32; 3n (n is a natural number that is 2 or more) scan lines 33 which are arranged parallel or almost parallel to each other and whose potentials are controlled by the scan line driver circuit 31; and m (m is a natural number that is 2 or more) signal lines 341, m signal lines 342, and m signal lines 343 which are arranged parallel or almost parallel to each other and whose potentials are controlled by the signal line driver circuit 32.

The pixel portion 30 is divided into three regions (regions 301 to 303) and includes a plurality of pixels which are arranged in matrix (n rows by m columns) in each region. Note that each of the scan lines 33 is electrically connected to m pixels provided in a given row among the plurality of pixels arranged in matrix (3n rows by the m columns) in the pixel portion 30. In addition, each of the signal lines 341 is electrically connected to n pixels provided in a given column among the plurality of pixels arranged in matrix (the n rows by the m columns) in the region 301. Further, each of the signal lines 342 is electrically connected to n pixels provided in a given column among the plurality of pixels arranged in matrix (the n rows by the m columns) in the region 302. Furthermore, each of the signal lines 343 is electrically connected to n pixels provided in a given column among the plurality of pixels arranged in matrix (the n rows by the m columns) in the region 303.

Note that a start signal (GSP) for the scan line driver circuit, the clock signal (GCK) for the scan line driver circuit, and drive power supply potentials such as a high power supply potential and a low power supply potential are input to the scan line driver circuit 31 from the outside. Further, signals such as the start signal (SSP) for the signal line driver circuit, the clock signal (SCK) for the signal line driver circuit, and image signals (data1 to data3), and drive power supply potentials such as a high power supply potential and a low power supply potential are input to the signal line driver circuit 32 from the outside.

Figure 6B:
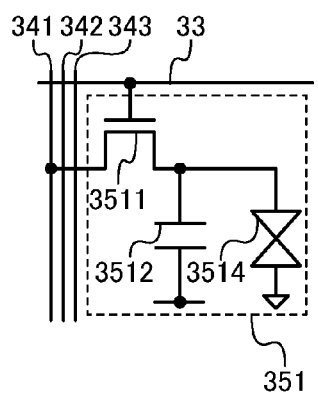
FIGS. 6B to 6D illustrate structure examples of pixels.
Figure 6C:
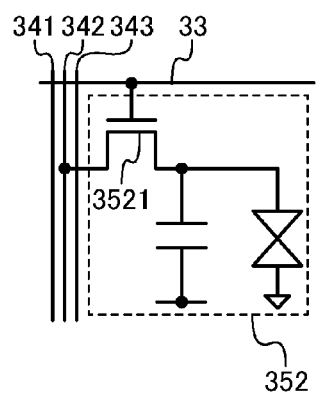
Figure 6D:
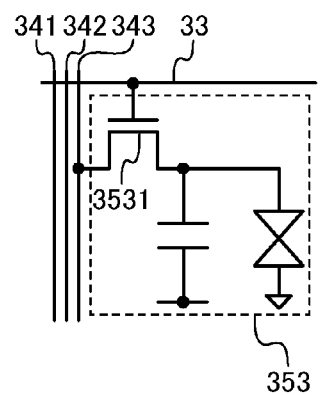

FIGS. 6B to 6D illustrate examples of the circuit structures of pixels. Specifically, FIG. 6B illustrates an example of the circuit structure of a pixel 351 provided in the region 301; FIG. 6C illustrates an example of the circuit structure of a pixel 352 provided in the region 302; and FIG. 6D illustrates an example of the circuit structure of a pixel 353 provided in the region 303. The pixel 351 illustrated in FIG. 6B includes a transistor 3511, a capacitor 3512, and a liquid crystal element 3514. A gate of the transistor 3511 is electrically connected to the scan line 33. One of a source and a drain of the transistor 3511 is electrically connected to the signal line 341. One electrode of the capacitor 3512 is electrically connected to the other of the source and drain of the transistor 3511. The other electrode of the capacitor 3512 is electrically connected to a wiring for supplying a capacitor potential. One electrode of the liquid crystal element 3514 is electrically connected to the other of the source and the drain of the transistor 3511 and one electrode of the capacitor 3512. The other electrode of the liquid crystal element 3514 is electrically connected to a wiring for supplying a counter potential.

The circuit structures of the pixel 352 illustrated in FIG. 6C and the pixel 353 illustrated in FIG. 6D are the same as that of the pixel 351 illustrated in FIG. 6B. Note that the pixel 352 illustrated in FIG. 6C differs from the pixel 351 illustrated in FIG. 6B in that one of a source and a drain of a transistor 3521 is electrically connected to the signal line 342 instead of the signal line 341; and the pixel 353 illustrated in FIG. 6D differs from the pixel 351 illustrated in FIG. 6B in that one of a source and a drain of a transistor 3531 is electrically connected to the signal line 343 instead of the signal line 341.

<Structure Example of Scan Line Driver Circuit 31>

Figure 7A:
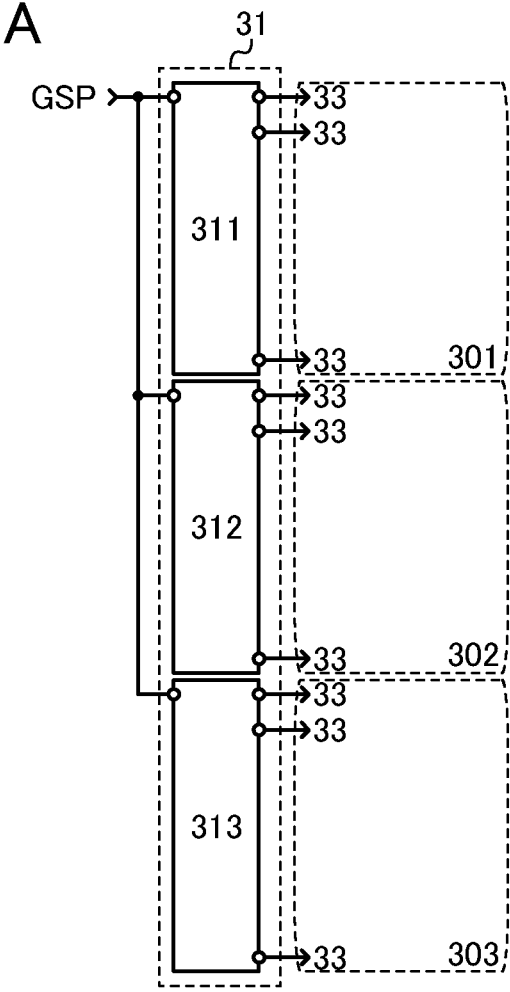
FIG. 7A illustrates a structure example of a scan line driver circuit.

FIG. 7A illustrates a structure example of the scan line driver circuit 31 included in the liquid crystal display device illustrated in FIG. 6A. The scan line driver circuit 31 illustrated in FIG. 7A includes shift registers 311 to 313 each including n output terminals. Note that each output terminal of the shift register 311 is electrically connected to one of the n scan lines 33 provided in the region 301. Each output terminal of the shift register 312 is electrically connected to one of the n scan lines 33 provided in the region 302. Each output terminal of the shift register 313 is electrically connected to one of the n scan lines 33 provided in the region 303. In other words, the shift register 311 supplies selection signals in the region 301; the shift register 312 supplies selection signals in the region 302; and the shift register 313 supplies selection signals in the region 303. Specifically, the shift register 311 has a function of sequentially supplying selection signals (sequentially selecting the scan lines 33 every half the cycle of the clock signal (GCK) for the scan line driver circuit) from the scan line 33 provided in a first row with the start signal (GSP) for the scan line driver circuit that is input from the outside served as a trigger; the shift register 312 has a function of sequentially supplying selection signals from the scan line 33 provided in the (n+1)th row with the start signal (GSP) for the scan line driver circuit that is input from the outside served as a trigger; and the shift register 313 has a function of sequentially supplying selection signals from the scan line 33 provided in the (2n+1)th row with the start signal (GSP) for the scan line driver circuit that is input from the outside served as a trigger.

<Operation Example of Scan Line Driver Circuit 31>

Figure 7B:
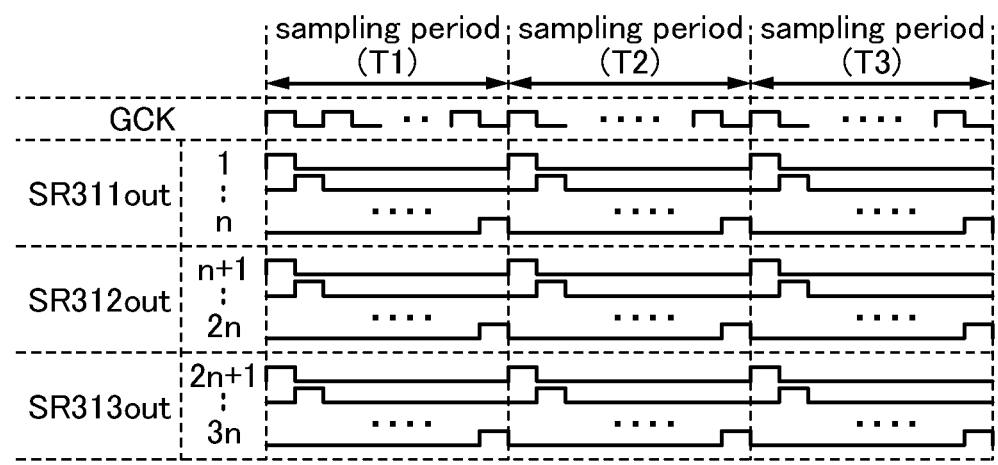
FIG. 7B illustrates output signals of shift registers.

An operation example of the scan line driver circuit 31 is described with reference to FIG. 7B. Note that FIG. 7B illustrates the clock signal (GCK) for the scan line driver circuit, signals (SR311out) output from the n output terminals of the shift register 311, signals (SR312out) output from the n output terminals of the shift register 312, and signals (SR313out) output from the n output terminals of the shift register 313.

In a sampling period (T1), high-level potentials are sequentially shifted from the scan line 33 provided in the first row to the scan line 33 provided in the n-th row every half the cycle of the clock signal (horizontal scan period) in the shift register 311; high-level potentials are sequentially shifted from the scan line 33 provided in the (n+1)th row to the scan line 33 provided in the 2n-th row every half the cycle of the clock signal (horizontal scan period) in the shift register 312; and high-level potentials are sequentially shifted from the scan line 33 provided in the (2n+1)th row to the scan line 33 provided in the 3n-th row every half the cycle of the clock signal (horizontal scan period) in the shift register 313. Therefore, in the scan line driver circuit 31, m pixels 351 provided in the first row to m pixels 351 provided in the n-th row are sequentially selected through the scan lines 33; m pixels 352 provided in the (n+1)th row to m pixels 352 provided in the 2n-th row are sequentially selected; and m pixels 353 provided in the (2n+1)th row to m pixels 353 provided in the 3n-th row are sequentially selected. In other words, in the scan line driver circuit 31, selection signals can be supplied to 3m pixels provided in different three rows every horizontal scan period.

In a sampling period (T2) and a sampling period (T3), the operation of the shift registers 311 to 313 is the same as that in the sampling period (T1). In other words, in the scan line driver circuit 31, as in the sampling period (T1), selection signals can be supplied to 3m pixels provided in given three rows every horizontal scan period.

<Structure Example of Signal Line Driver Circuit 32>

Figure 8:
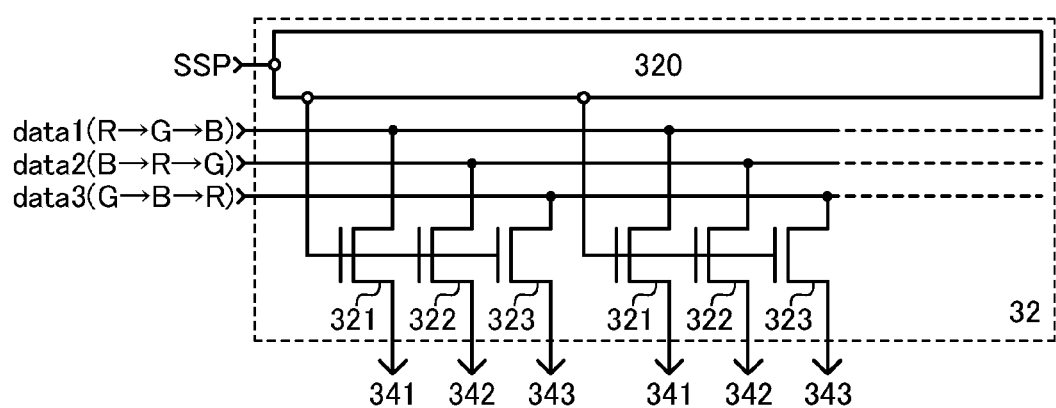
FIG. 8 illustrates a structure example of a signal line driver circuit.

FIG. 8 illustrates a structure example of the signal line driver circuit 32 included in the liquid crystal display device illustrated in FIG. 6A. The signal line driver circuit 32 illustrated in FIG. 8 includes a shift register 320 having m output terminals, m transistors 321, m transistors 322, and m transistors 323. Note that a gate of the transistor 321 is electrically connected to a j-th output terminal (j is a natural number that is 1 or more and m or less) of the shift register 320; one of a source and a drain of the transistor 321 is electrically connected to a wiring for supplying the first image signal (data1); and the other of the source and the drain of the transistor 321 is electrically connected to the signal line 341 provided in a j-th column in the pixel portion 30. In addition, a gate of the transistor 322 is electrically connected to the j-th output terminal of the shift register 320; one of a source and a drain of the transistor 322 is electrically connected to a wiring for supplying the second image signal (data2); and the other of the source and the drain of the transistor 322 is electrically connected to the signal line 342 provided in the j-th column in the pixel portion 30. Further, a gate of the transistor 323 is electrically connected to the j-th output terminal of the shift register 320; one of a source and a drain of the transistor 323 is electrically connected to a wiring for supplying the third image signal (data3); and the other of the source and the drain of the transistor 323 is electrically connected to the signal line 343 provided in the j-th column in the pixel portion 30.

Note that here, in the sampling period (T1), a red (R) image signal (an image signal for controlling transmission of red (R) light) is supplied to the signal line 341 as the first image signal (data1); in the sampling period (T2), a green (G) image signal (an image signal for controlling transmission of green (G) light) is supplied to the signal line 341 as the first image signal (data1); and in the sampling period (T3), a blue (B) image signal (an image signal for controlling transmission of blue (B) light) is supplied to the signal line 341 as the first image signal (data1). In addition, in the sampling period (T1), the blue (B) image signal is supplied to the signal line 342 as the second image signal (data2); in the sampling period (T2), the red (R) image signal is supplied to the signal line 342 as the second image signal (data2); and in the sampling period (T3), the green (G) image signal is supplied to the signal line 342 as the second image signal (data2). Further, in the sampling period (T1), the green (G) image signal is supplied to the signal line 343 as the third image signal (data3); in the sampling period (T2), the blue (B) image signal is supplied to the signal line 343 as the third image signal (data3); and in the sampling period (T3), the red (R) image signal is supplied to the signal line 343 as the third image signal (data3).

<Structure Example of Backlight>

The backlight described in Embodiment 1 can be used as a backlight of the liquid crystal display device described in this embodiment. Therefore, the above description is to be referred to.

<Operation Example of Liquid Crystal Display Device>

The liquid crystal display device described in this embodiment can operate like the liquid crystal display device described in Embodiment 1 (see FIG. 5). In other words, in the liquid crystal display device described in this embodiment, in the sampling period (T1), the m pixels 351 provided in the first row to the m pixels 351 provided in the n-th row are sequentially selected; the m pixels 352 provided in the (n+1)th row to the m pixels 352 provided in the 2n-th row are sequentially selected; and the m pixels 353 provided in the (2n+1)th row to the m pixels 353 provided in the 3n-th row are sequentially selected. Thus, the image signal can be input to each pixel.

Further, in the liquid crystal display device in this embodiment, as in the liquid crystal display device described in Embodiment 1, a selection signal and light of a given color can be supplied concurrently every region (the first to n-th rows, the (n+1) to 2n-th rows, and the (2n+1) to 3n-th rows).

<Liquid Crystal Display Device in This Embodiment>

The liquid crystal display device described in this embodiment operates like the liquid crystal display device described in Embodiment 1. In addition, as compared to the liquid crystal display device described in Embodiment 1, in the liquid crystal display device described in this embodiment, the aperture ratio can be further improved because the number of scan lines provided in the pixel portion and the number of transistors provided in each pixel are reduced. Further, because the number of scan lines provided in the pixel portion can be reduced, parasitic capacitance generated by overlap of the signal line and the scan line can be reduced; thus, the signal line can operate at high speed. Furthermore, the area of the scan line driver circuit and the number of signals that are necessary for the operation of the scan line driver circuit can be reduced (it is not necessary to input different start signals for the scan line driver circuit to a plurality of shift registers).

<Modification Example>

The liquid crystal display device described in this embodiment is one embodiment of the present invention, and the present invention includes a liquid crystal display device which is different from the aforementioned liquid crystal display device. For example, the structure of the liquid crystal display device described in this embodiment can be changed to the structure described in the modification example in Embodiment 1. Specifically, the shift register included in the liquid crystal display device in this embodiment can be replaced with a circuit having a similar function (e.g., a decoder).

In addition, the liquid crystal display device described in this embodiment has a structure where the pixel portion 30 is divided into three regions; however, the structure of the liquid crystal display device described in this embodiment is not limited to such a structure. In other words, in the liquid crystal display device described in this embodiment, the pixel portion 30 can be divided into given plural regions. Note that it is obvious that in the case where the number of regions is changed, the number of regions and the number of shift registers should be the same.

Further, in the liquid crystal display device described in this embodiment, the number of pixels included in each of the three regions is the same (pixels are arranged in n rows and m columns in each region); however, in the liquid crystal display device described in this embodiment, the number of pixels can vary between regions. Specifically, pixels can be arranged in c rows and the m columns (c is a natural number) in a first region, and pixels can be arranged in d rows and the m columns (d is a natural number which is different from c) in a second region.

Embodiment 3

In this embodiment, the specific structure of the liquid crystal display device described in Embodiment 1 or 2 is described.

<Specific Example of Cross Section of Pixel>

Figure 9:
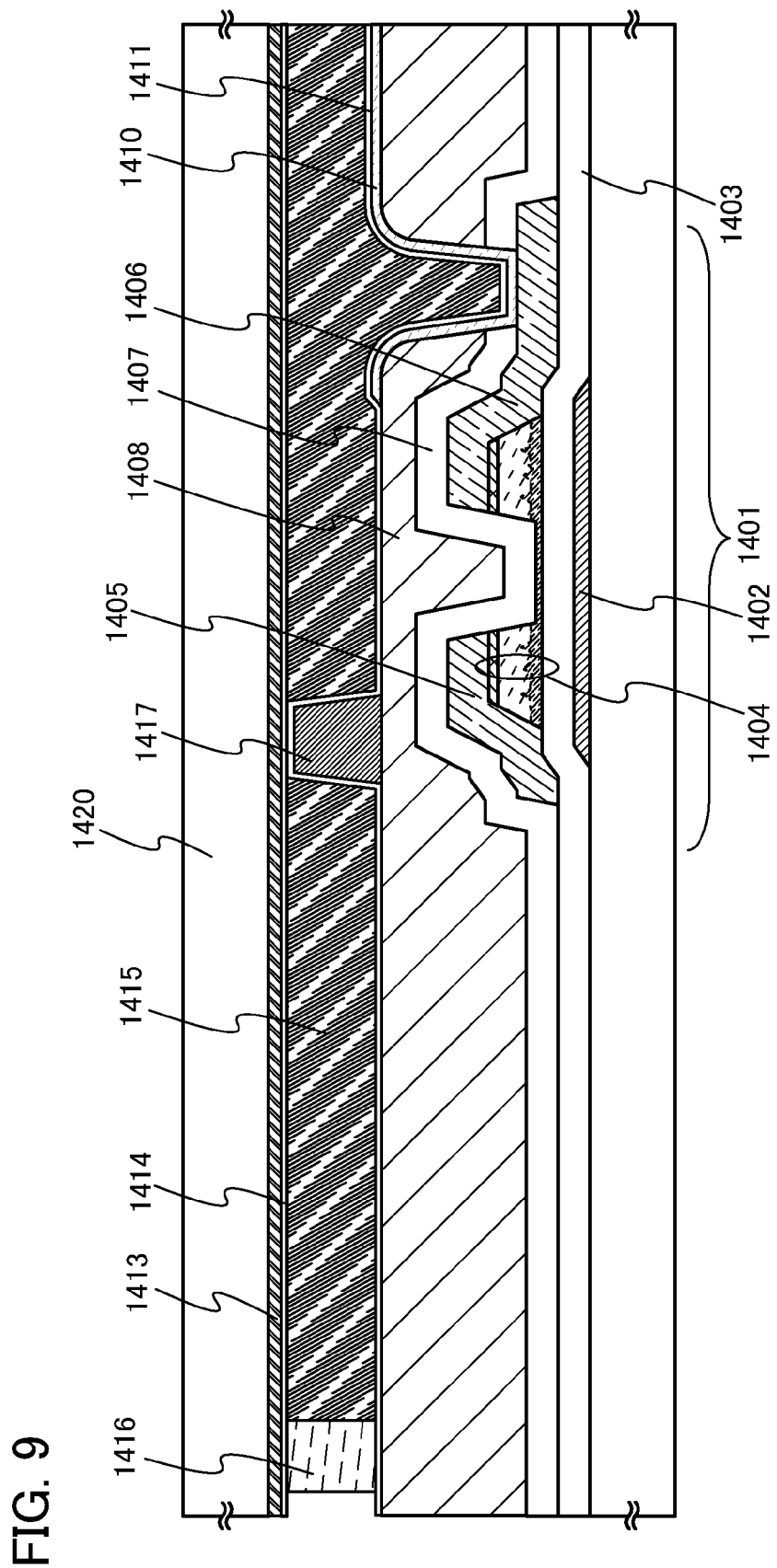
FIG. 9 is a cross-sectional view illustrating a specific example of a pixel.

FIG. 9 is an example of the cross-sectional view of a pixel in a liquid crystal display device according to one embodiment of the present invention. Note that although FIG. 9 illustrates a transistor including a microcrystalline semiconductor, a transistor including an amorphous semiconductor may be used.

A transistor 1401 illustrated in FIG. 9 includes a gate layer 1402 formed over an insulating surface, a gate insulating layer 1403 over the gate layer 1402, a semiconductor layer 1404 including a microcrystalline semiconductor that is over the gate insulating layer 1403 and that overlaps with the gate layer 1402, and conductive films 1405 and 1406 which function as a source layer and a drain layer and which are stacked over the semiconductor layer 1404. Further, the transistor 1401 may include an insulating layer 1407 formed over the semiconductor layer 1404 as a component. The insulating layer 1407 is formed so as to cover the gate layer 1402, the gate insulating layer 1403, the semiconductor layer 1404, and the conductive films 1405 and 1406.

An insulating layer 1408 is formed over the insulating layer 1407. An opening is provided in part of the insulating layer 1407 and part of the insulating layer 1408, and a pixel electrode 1410 is formed so as to be in contact with the conductive film 1406 through the opening.

Further, a spacer 1417 for controlling the cell gap of a liquid crystal element is formed over the insulating layer 1408. An insulating layer is etched to have a desired shape, so that the spacer 1417 can be formed. Alternatively, the cell gap may be controlled by dispersion of a spherical spacer over the insulating layer 1408.

An alignment film 1411 is formed over the pixel electrode 1410. Further, a counter substrate 1420 is provided with a counter electrode 1413 which faces the pixel electrode 1410, and an alignment film 1414 is formed on a side of the counter electrode 1413 that is close to the pixel electrode 1410. The alignment film 1411 and the alignment film 1414 can be formed using organic resins such as polyimide and poly(vinyl alcohol). Alignment treatment for aligning liquid crystal molecules in a certain direction, such as rubbing, is performed on their surfaces. A roller wrapped with cloth of nylon or the like is rolled while being in contact with the alignment film so that the surface of the alignment film can be rubbed in a certain direction. Note that it is also possible to form the alignment films 1411 and 1414 that have alignment characteristics with the use of inorganic materials such as silicon oxide by evaporation or the like, without alignment treatment.

Further, liquid crystals 1415 are provided in a region which is surrounded by a sealant 1416 between the pixel electrode 1410 and the counter electrode 1413. The liquid crystals 1415 may be injected by a dispenser method (a dripping method) or a dipping method (a pumping method). Note that a filler may be mixed in the sealant 1416.

A light-blocking film which can block light may be formed between pixels so that disclination caused by disorder of alignment of the liquid crystals 1415 between the pixels is prevented from being observed. The light-blocking film can be formed using an organic resin containing a black pigment such as a carbon black or low-valent titanium oxide. Alternatively, the light-blocking film can be formed using a film including chromium.

The pixel electrode 1410 and the counter electrode 1413 can be formed using transparent conductive materials such as indium tin oxide including silicon oxide (ITSO), indium tin oxide (ITO), zinc oxide (ZnO), indium zinc oxide (IZO), and zinc oxide to which gallium is added (GZO), for example.

Note that although a TN (twisted nematic) liquid crystal display device is used as the liquid crystal display device here, a different liquid crystal display device such as a VA (vertical alignment) liquid crystal display device, an OCB (optically compensated birefringence) liquid crystal display device, an IPS (in-plane switching) liquid crystal display device, or an MVA (multi-domain vertical alignment) liquid crystal display device may be used.

Alternatively, a liquid crystal exhibiting a blue phase for which an alignment film is unnecessary may be used. A blue phase is one of liquid crystal phases, which is observed just before a cholesteric phase changes into an isotropic phase while the temperature of a cholesteric liquid crystal is increased. Since the blue phase appears only in a narrow temperature range, a chiral agent or an ultraviolet curable resin is added so that the temperature range is improved. Specifically, a liquid crystal composition in which 5 wt. % or more of a chiral agent is mixed is used for the liquid crystal 1415. The liquid crystal composition which includes a liquid crystal exhibiting a blue phase and a chiral agent has a short response time of 10 to 100 µs. The liquid crystal display device including the liquid crystal composition does not require an alignment film and has a small viewing angle dependence. A liquid crystal with such characteristics is particularly preferable as a liquid crystal included in the liquid crystal display device (a liquid crystal display device which needs to input image signals to each pixel plural times in order to display images).

Note that FIG. 9 illustrates a liquid crystal element with a structure where the liquid crystals 1415 are provided between the pixel electrode 1410 and the counter electrode 1413; however, the structure of the liquid crystal display device according to one embodiment of the present invention is not limited to this structure. Like an IPS liquid crystal element or a liquid crystal element using a liquid crystal exhibiting a blue phase, a pair of electrodes may be formed over one substrate.

<Specific Example of Connection between Pixel Portion and Driver Circuit>

Next, a method for connecting terminals to each other when a substrate provided with a driver circuit is directly mounted on a substrate provided with a pixel portion is described.

Figure 10A:
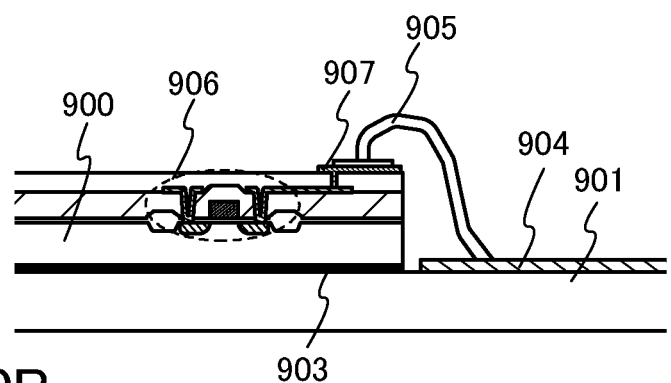
FIGS. 10A to 10C illustrate specific examples of connections between terminals.

FIG. 10A is the cross-sectional view of a portion where a substrate 900 provided with a driver circuit and a substrate 901 provided with a pixel portion are connected to each other by wire bonding. The substrate 900 is attached onto the substrate 901 with an adhesive 903. The substrate 900 is provided with a transistor 906 included in the driver circuit. In addition, the transistor 906 is electrically connected to a pad 907 that is formed so as to be exposed on a surface of the substrate 900 and that functions as a terminal A terminal 904 is provided over the substrate 901 illustrated in FIG. 10A, and the pad 907 and the terminal 904 are connected to each other with a wire 905.

Figure 10B:
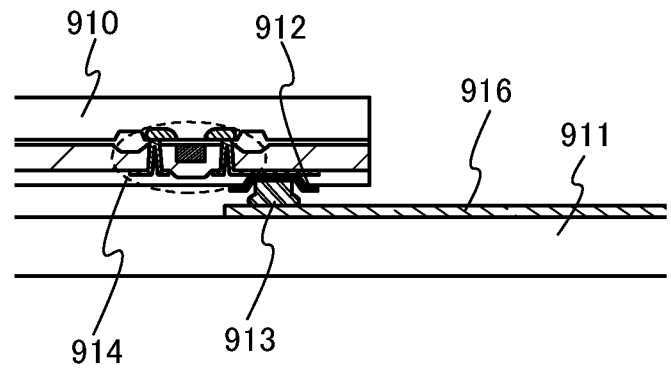

Next, FIG. 10B is the cross-sectional view of a portion where a substrate 911 provided with a pixel portion and a substrate 910 provided with a driver circuit are connected to each other by a flip-chip method. In FIG. 10B, a solder ball 913 is connected to a pad 912 formed so as to be exposed on a surface of the substrate 910. Thus, a transistor 914 included in the driver circuit provided on the substrate 910 is electrically connected to the solder ball 913 through the pad 912. In addition, the solder ball 913 is connected to a terminal 916 formed over the substrate 911.

Note that the solder ball 913 and the terminal 916 can be connected to each other by any of a variety of methods such as thermocompression bonding and thermocompression bonding with vibration generated with ultrasonic waves. The mechanical strength of a connection portion or the efficiency of diffusion or the like of heat generated in the substrate 911 may be increased when an under-fill resin is provided between the substrate 910 and the substrate 911 so that a space between the solder balls subjected to the thermocompression bonding is filled with the under-fill resin. The under-fill resin is not necessarily provided; however, with the under-fill resin, poor connection caused by stress generated by mismatch of the thermal expansion coefficient of the substrate 910 and the thermal expansion coefficient of the substrate 911 can be prevented. In the case of thermocompression bonding with vibration generated with ultrasonic waves, poor connection can be prevented more efficiently as compared to thermocompression bonding.

The flip-chip method is suitable for connection when the number of terminals is large because a pitch between pads can be increased as compared to the wire bonding even when the number of pads that should be connected is increased.

Note that a droplet discharge method by which a liquid in which metal nanoparticles are dispersed is discharged may be employed.

Figure 10C:
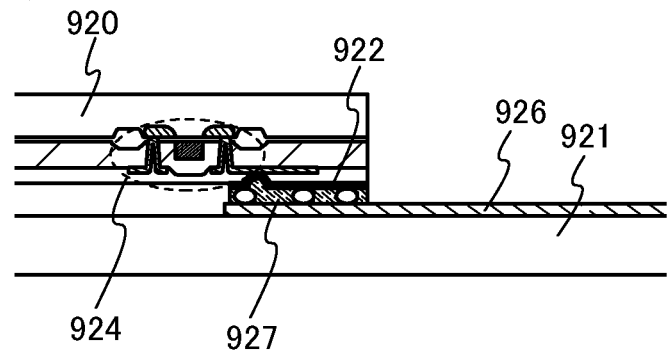

Next, FIG. 10C is the cross-sectional view of a portion where a substrate 921 provided with a pixel portion and a substrate 920 provided with a driver circuit are connected to each other with an anisotropic conductive resin. In FIG. 10C, a pad 922 formed so as to be exposed on a surface of the substrate 920 is electrically connected to a transistor 924 included in the driver circuit provided on the substrate 920. In addition, the pad 922 is connected to a terminal 926 formed over the substrate 921 with an anisotropic conductive resin 927.

Note that the connection method is not limited to the methods illustrated in FIGS. 10A to 10C. The terminals may be connected to each other with a combination of the wire bonding and the flip-chip method.

<First Specific Example of Driver Circuit Mounted on Substrate Including Pixel Portion>

Next, a method for mounting a substrate including a driver circuit (such a substrate is also referred to as an IC chip) is described.

Figure 11A:
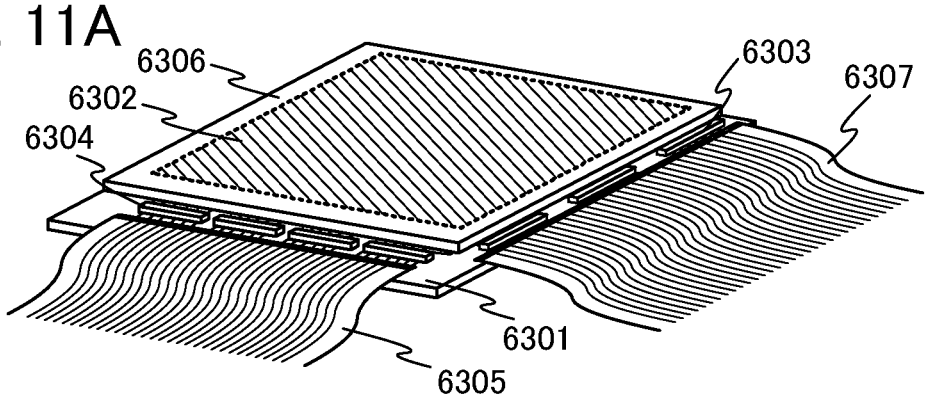
FIGS. 11A and 11B are perspective views illustrating specific examples of liquid crystal display devices.

A liquid crystal display device illustrated in FIG. 11A includes a pixel portion 6302 over a substrate 6301. A counter substrate 6306 overlaps with the substrate 6301 so as to cover the pixel portion 6302. A substrate 6303 provided with a scan line driver circuit and a substrate 6304 provided with a signal line driver circuit are directly mounted on the substrate 6301. Specifically, the scan line driver circuit provided on the substrate 6303 and the signal line driver circuit provided on the substrate 6304 are attached to the substrate 6301 and are electrically connected to the pixel portion 6302. In addition, power supply potentials, a variety of signals, and the like are supplied to the pixel portion 6302, the scan line driver circuit provided on the substrate 6303, and the signal line driver circuit provided on the substrate 6304 through an FPC 6305 or an FPC 6307.

Figure 11B:
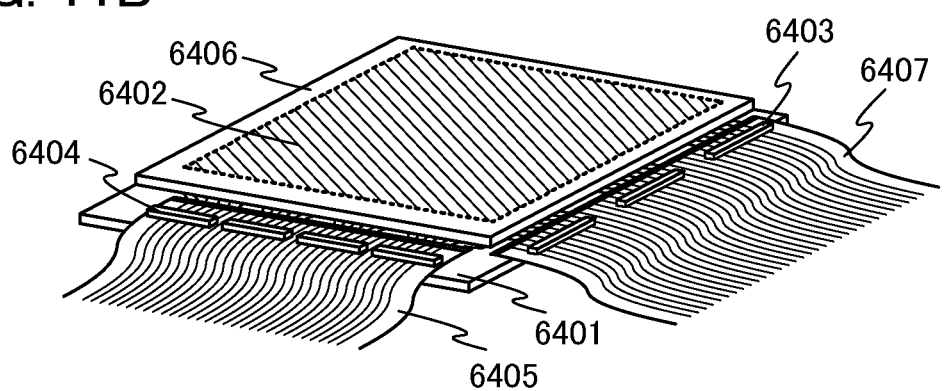

A liquid crystal display device illustrated in FIG. 11B includes a pixel portion 6402 over a substrate 6401. A counter substrate 6406 overlaps with the substrate 6401 so as to cover the pixel portion 6402. A substrate 6403 provided with a scan line driver circuit is mounted on an FPC 6407 connected to the substrate 6401. A substrate 6404 provided with a signal line driver circuit is mounted on an FPC 6405 connected to the substrate 6401. In addition, power supply potentials, a variety of signals, and the like are supplied to the pixel portion 6402, the scan line driver circuit provided on the substrate 6403, and the signal line driver circuit provided on the substrate 6404 through the FPC 6405 or the FPC 6407.

A mounting method of the substrate is not particularly limited to a certain method, and a known COG method, wire bonding, a TAB method, or the like can be employed. In addition, positions where the IC chips are mounted are not limited to the positions illustrated in FIGS. 11A and 11B as long as electrical connection is possible. Further, a controller, a CPU, a memory, or the like may be formed using an IC chip and may be mounted on the substrate provided with the pixel portion.

<Second Specific Example of Driver Circuit Mounted on Substrate Including Pixel Portion>

Figure 23A:
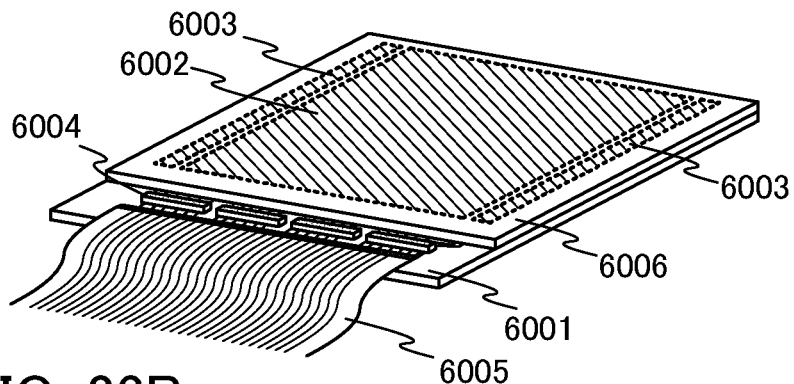
FIGS. 23A to 23C are perspective views illustrating specific examples of liquid crystal display devices.
Figure 23B:
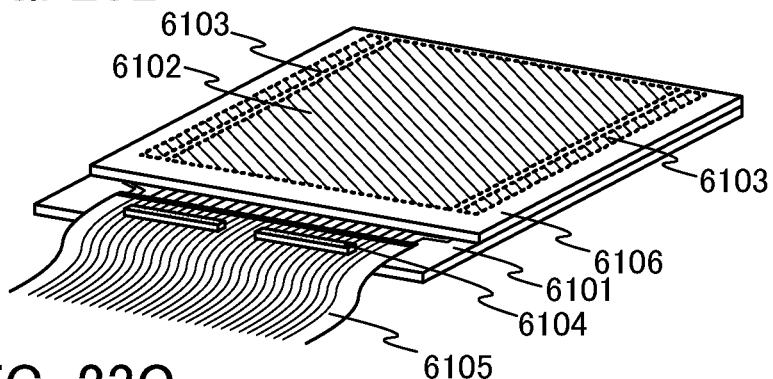
Figure 23C:
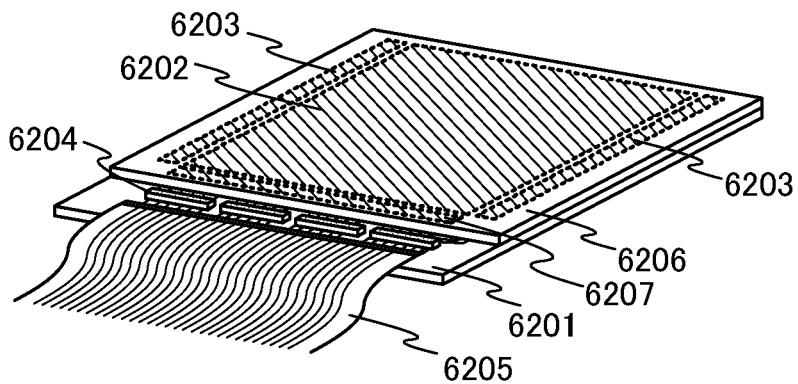

Next, mounting methods of a substrate including a driver circuit that are different from the mounting methods of a substrate including a driver circuit illustrated in FIGS. 11A and 11B are described with reference to FIGS. 23A to 23C. Specifically, methods for mounting a substrate provided with all or part of a signal line driver circuit on a substrate provided with a pixel portion and a scan line driver circuit (or the scan line driver circuit and part of the signal line driver circuit) are described with reference to FIGS. 23A to 23C. To put it briefly, each of the structures illustrated in FIGS. 23A to 23C is different from each of the structures illustrated in FIGS. 11A and 11B in that the scan line driver circuit (or the scan line driver circuit and part of the signal line driver circuit) is/are formed over the substrate provided with the pixel portion. In that case, in terms of manufacturing steps, it is preferable that a transistor included in the pixel portion and a transistor included in the scan line driver circuit (or the scan line driver circuit and part of the signal line driver circuit) have the same structure. Further, the transistor included in the scan line driver circuit (or the scan line driver circuit and part of the signal line driver circuit) needs high response speed. Thus, in each of the structures illustrated in FIGS. 23A to 23C, a transistor including a microcrystalline semiconductor is preferably used as each of the transistor included in the pixel portion and the transistor included in the scan line driver circuit (or the scan line driver circuit and part of the signal line driver circuit).

A liquid crystal display device illustrated in FIG. 23A includes a pixel portion 6002 and scan line driver circuits 6003 over a substrate 6001. A counter substrate 6006 overlaps with the substrate 6001 so as to cover the pixel portion 6002 and the scan line driver circuits 6003. A substrate 6004 provided with a signal line driver circuit is directly mounted on the substrate 6001. Specifically, the signal line driver circuit provided on the substrate 6004 is attached to the substrate 6001 and is electrically connected to the pixel portion 6002. In addition, power supply potentials, a variety of signals, and the like are supplied to the pixel portion 6002, the scan line driver circuits 6003, and the signal line driver circuit provided on the substrate 6004 through an FPC 6005.

A liquid crystal display device illustrated in FIG. 23B includes a pixel portion 6102 and scan line driver circuits 6103 over a substrate 6101. A counter substrate 6106 overlaps with the substrate 6101 so as to cover the pixel portion 6102 and the scan line driver circuits 6103. A substrate 6104 provided with a signal line driver circuit is mounted on an FPC 6105 connected to the substrate 6101. In addition, power supply potentials, a variety of signals, and the like are supplied to the pixel portion 6102, the scan line driver circuits 6103, and the signal line driver circuit provided on the substrate 6104 through the FPC 6105.

A liquid crystal display device illustrated in FIG. 23C includes a pixel portion 6202, scan line driver circuits 6203, and a part 6207 of a signal line driver circuit over a substrate 6201. A counter substrate 6206 overlaps with the substrate 6201 so as to cover the pixel portion 6202, the scan line driver circuits 6203, and the part 6207 of the signal line driver circuit. A substrate 6204 provided with a different part of the signal line driver circuit is directly mounted on the substrate 6201. Specifically, the different part of the signal line driver circuit provided on the substrate 6204 is attached to the substrate 6201 and is electrically connected to the part 6207 of the signal line driver circuit. In addition, power supply potentials, a variety of signals, and the like are supplied to the pixel portion 6202, the scan line driver circuits 6203, the part 6207 of the signal line driver circuit, and the different part of the signal line driver circuit provided on the substrate 6204 through an FPC 6205.

A mounting method of the substrate is not particularly limited to a certain method, and a known COG method, wire bonding, a TAB method, or the like can be employed. In addition, positions where the IC chips are mounted are not limited to the positions illustrated in FIGS. 23A to 23C as long as electrical connection is possible. Further, a controller, a CPU, a memory, or the like may be formed using an IC chip and may be mounted on the substrate provided with the pixel portion.

<Specific Example of Liquid Crystal Display Device>

Figure 12A:
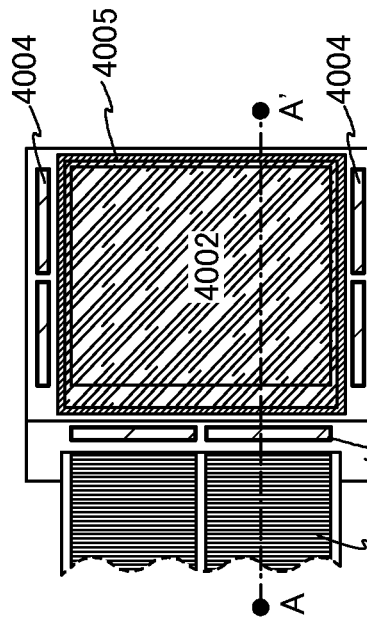
FIG. 12A is a top view illustrating a specific example of a liquid crystal display device.
Figure 12B:
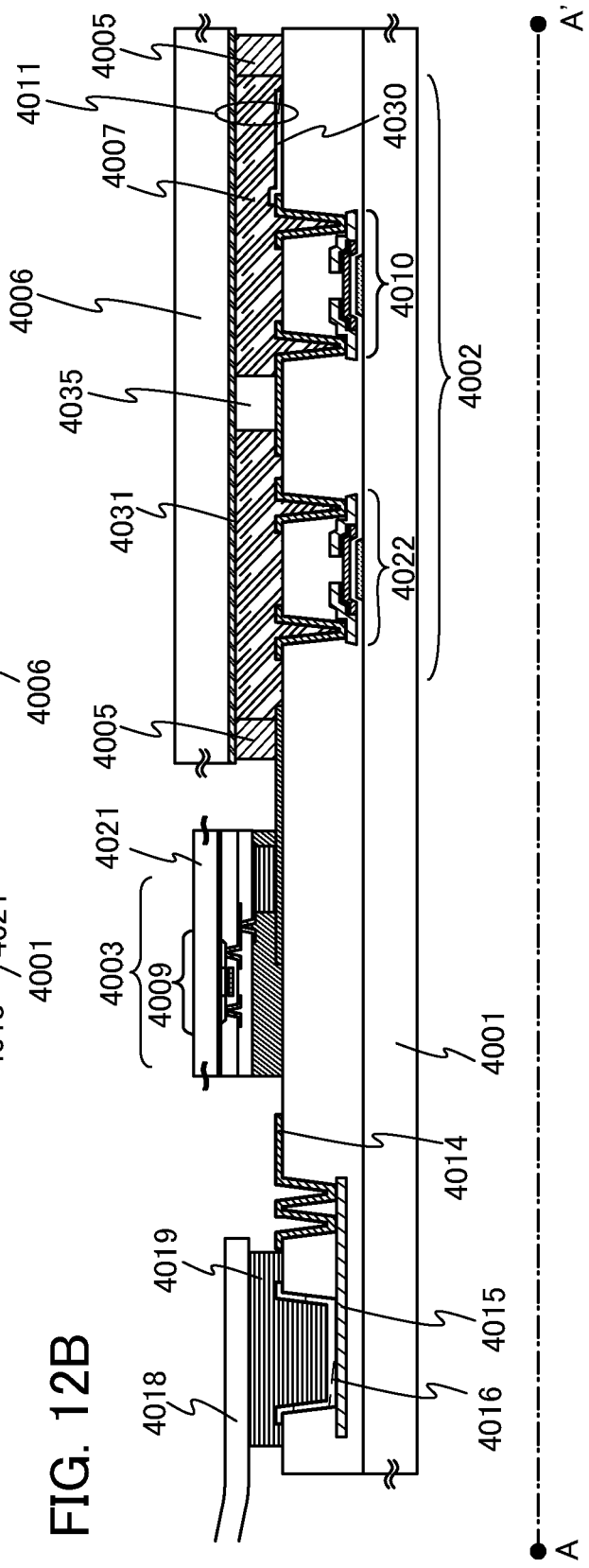
FIG. 12B is a cross-sectional view illustrating the specific example of the liquid crystal display device.

Next, an appearance of a panel of the liquid crystal display device according to one embodiment of the present invention is described with reference to FIGS. 12A and 12B. FIG. 12A is a top view of a panel where a substrate 4001 and a counter substrate 4006 are bonded to each other with a sealant 4005. FIG. 12B corresponds to a cross-sectional view taken along broken line A-A' in FIG. 12A.

The sealant 4005 is provided so as to surround a pixel portion 4002 provided over the substrate 4001. In addition, the counter substrate 4006 is provided over the pixel portion 4002. Thus, the pixel portion 4002 is sealed together with liquid crystals 4007 by the substrate 4001, the sealant 4005, and the counter substrate 4006.

A substrate 4021 provided with a signal line driver circuit 4003 and a substrate 4004 provided with a scan line driver circuit are mounted in a region which is different from a region surrounded by the sealant 4005 over the substrate 4001. FIG. 12B illustrates a transistor 4009 included in the signal line driver circuit 4003.

A plurality of transistors are included in the pixel portion 4002 provided over the substrate 4001. FIG. 12B illustrates transistors 4010 and 4022 which are included in the pixel portion 4002. Each of the transistors 4010 and 4022 includes an amorphous semiconductor or a microcrystalline semiconductor in a channel formation region.

A pixel electrode 4030 included in a liquid crystal element 4011 is electrically connected to the transistor 4010. A counter electrode 4031 of the liquid crystal element 4011 is formed on the counter substrate 4006. A portion where the pixel electrode 4030, the counter electrode 4031, and the liquid crystal 4007 overlap with each other corresponds to the liquid crystal element 4011.

A spacer 4035 is provided in order to control a distance (a cell gap) between the pixel electrode 4030 and the counter electrode 4031. Note that although FIG. 12B illustrates the case where the spacer 4035 is obtained by patterning of an insulating film, a spherical spacer may be used.

A variety of signals and potentials are supplied to the signal line driver circuit 4003, the scan line driver circuit, and the pixel portion 4002 from a connection terminal 4016 through lead wirings 4014 and 4015. The connection terminal 4016 is electrically connected to a terminal of an FPC 4018 through an anisotropic conductive film 4019.

Note that as the substrate 4001, the counter substrate 4006, and the substrate 4021, glass, ceramics, or plastics can be used. Plastics include a fiberglass-reinforced plastic (FRP) plate, a poly(vinyl fluoride) (PVF) film, a polyester film, an acrylic resin film, and the like.

Note that a light-transmitting material such as a glass plate, plastics, a polyester film, or an acrylic resin film is used for a substrate which is positioned in a direction from which light transmitted through the liquid crystal element 4011 is extracted.

Figure 24A:
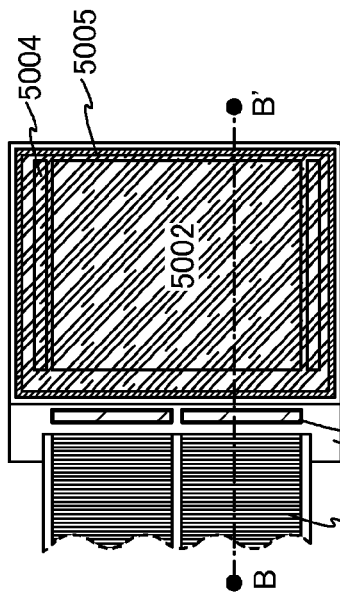
FIG. 24A is a top view illustrating a specific example of a liquid crystal display device.
Figure 24B:
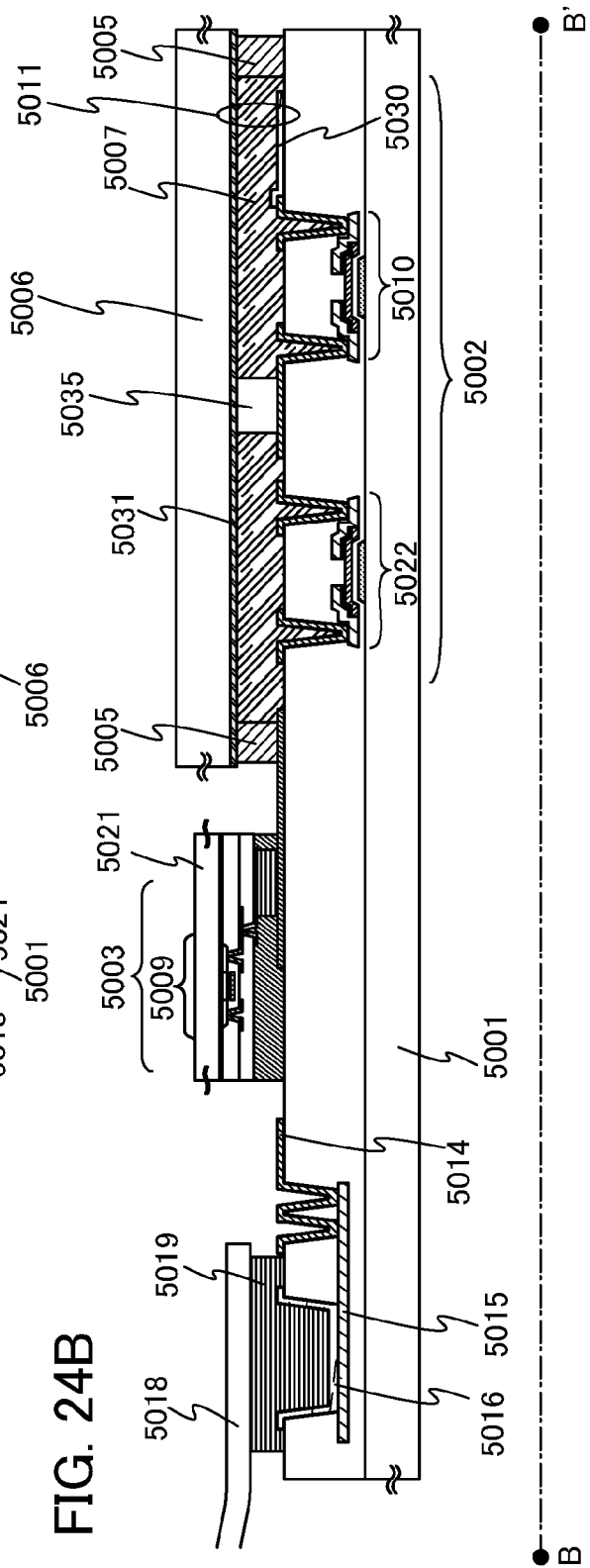
FIG. 24B is a cross-sectional view illustrating the specific example of the liquid crystal display device.

FIGS. 24A and 24B illustrate an appearance of a panel which is different from that of the liquid crystal display device illustrated in FIGS. 12A and 12B. Note that FIG. 24A is a top view of a panel where a substrate 5001 and a counter substrate 5006 are bonded to each other with a sealant 5005. FIG. 24B corresponds to a cross-sectional view taken along broken line B-B' in FIG. 24A. The liquid crystal display device illustrated in FIGS. 24A and 24B differs from the liquid crystal display device illustrated in FIGS. 12A and 12B in that not only a pixel portion 5002 but also a scan line driver circuit 5004 is formed over the substrate 5001.

In the liquid crystal display device illustrated in FIGS. 24A and 24B, the sealant 5005 is provided so as to surround the pixel portion 5002 and the scan line driver circuit 5004 which are provided over the substrate 5001. In addition, the counter substrate 5006 is provided over the pixel portion 5002 and the scan line driver circuit 5004. Thus, the pixel portion 5002 and the scan line driver circuit 5004 are sealed together with liquid crystals 5007 by the substrate 5001, the sealant 5005, and the counter substrate 5006.

A substrate 5021 provided with a signal line driver circuit 5003 is mounted in a region which is different from a region surrounded by the sealant 5005 over the substrate 5001. FIG. 24B illustrates a transistor 5009 included in the signal line driver circuit 5003.

A plurality of transistors are included in the pixel portion 5002 and the scan line driver circuit 5004 which are provided over the substrate 5001. FIG. 24B illustrates transistors 5010 and 5022 which are included in the pixel portion 5002. Each of the transistors 5010 and 5022 includes a microcrystalline semiconductor in a channel formation region.

A pixel electrode 5030 included in a liquid crystal element 5011 is electrically connected to the transistor 5010. A counter electrode 5031 of the liquid crystal element 5011 is formed on the counter substrate 5006. A portion where the pixel electrode 5030, the counter electrode 5031, and the liquid crystal 5007 overlap with each other corresponds to the liquid crystal element 5011.

A spacer 5035 is provided in order to control a distance (a cell gap) between the pixel electrode 5030 and the counter electrode 5031. Note that although FIG. 24B illustrates the case where the spacer 5035 is obtained by patterning of an insulating film, a spherical spacer may be used.

A variety of signals and potentials are supplied to the signal line driver circuit 5003, the scan line driver circuit 5004, and the pixel portion 5002 from a connection terminal 5016 through lead wirings 5014 and 5015. The connection terminal 5016 is electrically connected to a terminal of an FPC 5018 through an anisotropic conductive film 5019.

Note that as the substrate 5001, the counter substrate 5006, and the substrate 5021, glass, ceramics, or plastics can be used. Plastics include a fiberglass-reinforced plastic (FRP) plate, a poly(vinyl fluoride) (PVF) film, a polyester film, an acrylic resin film, and the like.

Note that a light-transmitting material such as a glass plate, plastics, a polyester film, or an acrylic resin film is used for a substrate which is positioned in a direction from which light transmitted through the liquid crystal element 5011 is extracted.

FIG. 13 is an example of a perspective view illustrating the structure of the liquid crystal display device according to one embodiment of the present invention. The liquid crystal display device illustrated in FIG. 13 includes a panel 1601 including a pixel portion, a first diffusion plate 1602, a prism sheet 1603, a second diffusion plate 1604, a light guide plate 1605, a backlight panel 1607, a circuit board 1608, and substrates 1611 provided with signal line driver circuits.

The panel 1601, the first diffusion plate 1602, the prism sheet 1603, the second diffusion plate 1604, the light guide plate 1605, and the backlight panel 1607 are sequentially stacked. The backlight panel 1607 includes a backlight 1612 including a plurality of backlight units. Light from the backlight 1612 that is diffused in the light guide plate 1605 is delivered to the panel 1601 through the first diffusion plate 1602, the prism sheet 1603, and the second diffusion plate 1604.

Although the first diffusion plate 1602 and the second diffusion plate 1604 are used in this embodiment, the number of diffusion plates is not limited to two. The number of diffusion plates may be one, or may be three or more. It is acceptable as long as the diffusion plate is provided between the light guide plate 1605 and the panel 1601. Thus, the diffusion plate may be provided only on a side closer to the panel 1601 than the prism sheet 1603, or may be provided only on a side closer to the light guide plate 1605 than the prism sheet 1603.

Further, the shape of the cross section of the prism sheet 1603 is not limited to a sawtooth shape illustrated in FIG. 13, but may be a shape with which light from the light guide plate 1605 can be concentrated on the panel 1601 side.

The circuit board 1608 includes a circuit for generating various kinds of signals to be input to the panel 1601, a circuit for processing the signals, and the like. In addition, in FIG. 13, the circuit board 1608 and the panel 1601 are connected to each other via COF tapes 1609. Further, the substrates 1611 provided with the signal line driver circuits are connected to the COF tapes 1609 by a chip on film (COF) method.

FIG. 13 illustrates an example in which the circuit board 1608 is provided with a control circuit which controls driving of the backlight 1612 and the control circuit and the backlight panel 1607 are connected to each other through an FPC 1610. Note that the control circuit may be formed over the panel 1601. In that case, the panel 1601 and the backlight panel 1607 are connected to each other through an FPC or the like.

<Specific Example of Liquid Crystal Display Device with Touch Panel>

Figure 14A:
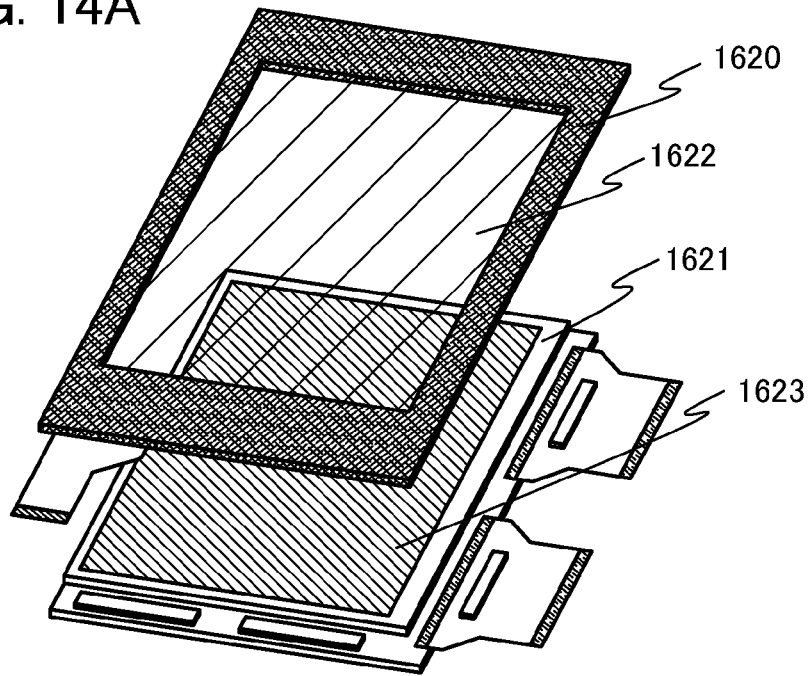
FIGS. 14A and 14B illustrate a specific example of a touch panel.

The liquid crystal display device according to one embodiment of the present invention may include a pointing device called a touch panel. FIG. 14A illustrates the case where a touch panel 1620 and a panel 1621 overlap with each other.

The touch panel 1620 can detect a position touched by a finger, a stylus, or the like in a light-transmitting position detection portion 1622 and can generate a signal including data on the position. Thus, when the touch panel 1620 is provided so that the position detection portion 1622 overlaps with a pixel portion 1623 of the panel 1621, data on a position in the pixel portion 1623 that is touched by the user of the liquid crystal display device can be obtained.

Figure 14B:
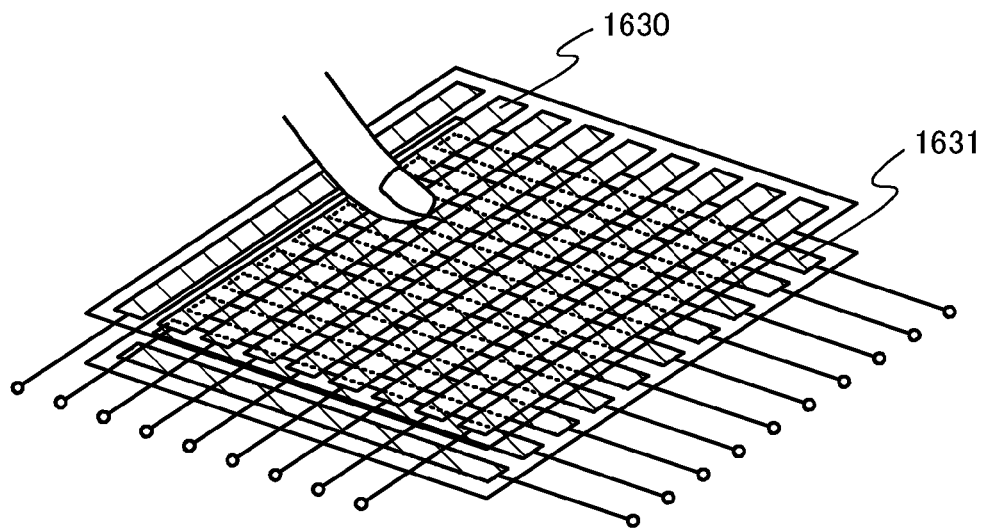

The position detection portion 1622 can detect positions by a variety of methods such as a resistive method, a capacitive method, and the like. FIG. 14B is a perspective view of the resistive position detection portion 1622. The resistive position detection portion 1622 is provided so that a plurality of first electrodes 1630 and a plurality of second electrodes 1631 face each other with spaces provided therebetween. When stress is applied to one of the plurality of first electrodes 1630 with a finger or the like, the first electrode 1630 is in contact with one of the plurality of second electrodes 1631. In addition, when the level of voltage of both ends of each of the plurality of first electrodes 1630 and the level of voltage of both ends of each of the plurality of second electrodes 1631 are monitored, it is possible to identify which first electrode 1630 is in contact with which second electrode 1631; thus, the position touched by the finger can be detected.

The first electrode 1630 and the second electrode 1631 can be formed using light-transmitting conductive materials such as indium tin oxide including silicon oxide (ITSO), indium tin oxide (ITO), zinc oxide (ZnO), indium zinc oxide (IZO), and zinc oxide to which gallium is added (GZO), for example.

Figure 15A:
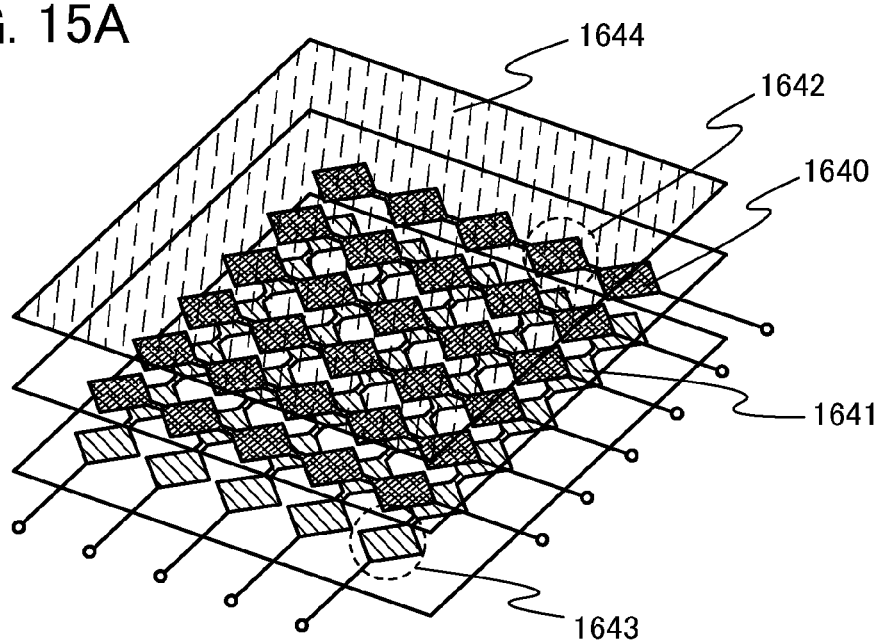
FIGS. 15A and 15B illustrate a specific example of a touch panel.

FIG. 15A is a perspective view of the position detection portion 1622 using a projected capacitive method as a capacitive method. The projected capacitive position detection portion 1622 is provided so that a plurality of first electrodes 1640 and a plurality of second electrodes 1641 overlap with each other. The plurality of first electrodes 1640 have a structure where a plurality of rectangular conductive films 1642 are connected to each other. The plurality of second electrodes 1641 have a structure where a plurality of rectangular conductive films 1643 are connected to each other. Note that the structures of the first electrodes 1640 and the second electrodes 1641 are not limited to these structures.

Figure 15B:
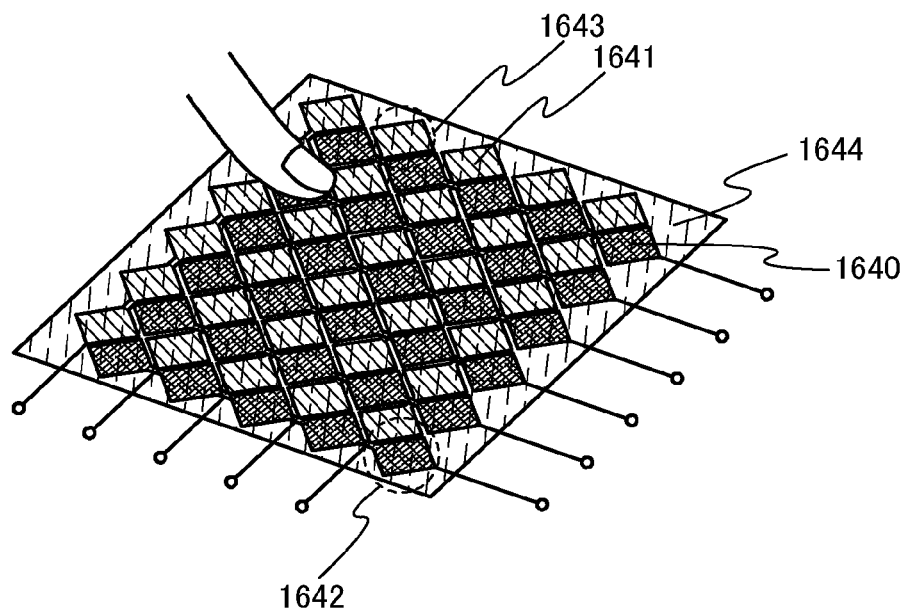

Further, in FIG. 15A, an insulating layer 1644 functioning as a dielectric overlaps with the plurality of first electrodes 1640 and the plurality of second electrodes 1641. FIG. 15B illustrates the case where the plurality of first electrodes 1640, the plurality of second electrodes 1641, and the insulating layer 1644 which are illustrated in FIG. 15A overlap with each other. As illustrated in FIG. 15B, the plurality of first electrodes 1640 and the plurality of second electrodes 1641 overlap with each other so that the position of the rectangular conductive film 1642 and the position of the rectangular conductive film 1643 are not aligned with each other.

When a finger or the like is in contact with the insulating layer 1644, capacitance is generated between one of the plurality first electrodes 1640 and the finger. Further, capacitance is generated between one of the plurality second electrodes 1641 and the finger. Thus, when changes in capacitance are monitored, it is possible to identify which first electrode 1640 and which second electrode 1641 are closest to the finger. Accordingly, the position touched by the finger can be detected.

<Specific Example of Liquid Crystal Display Device Including Photo Sensor>

Figure 16A:
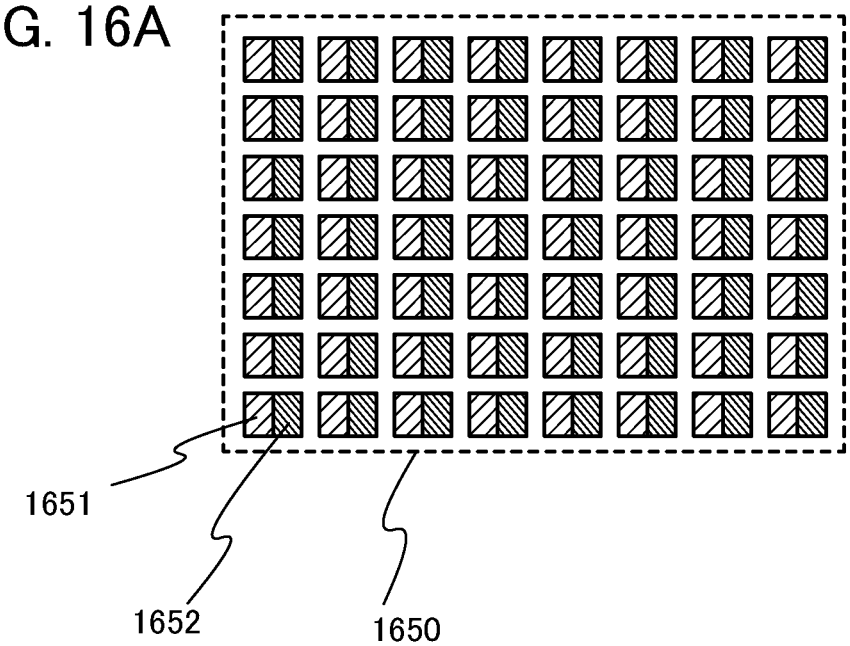
FIG. 16A illustrates a specific example of a pixel portion including a photo sensor.

The liquid crystal display device according to one embodiment of the present invention may include a photo sensor in a pixel portion. FIG. 16A schematically illustrates an example of the structure of the pixel portion including a photo sensor.

A pixel portion 1650 illustrated in FIG. 16A includes pixels 1651 and photo sensors 1652 corresponding to the pixels 1651. The photo sensor 1652 includes a transistor and a light-receiving element which has a function of generating an electrical signal when receiving light, such as a photodiode. Note that as light which is received by the photo sensor 1652, reflected light obtained when light from a backlight is delivered to an object to be detected can be used.

Figure 16B:
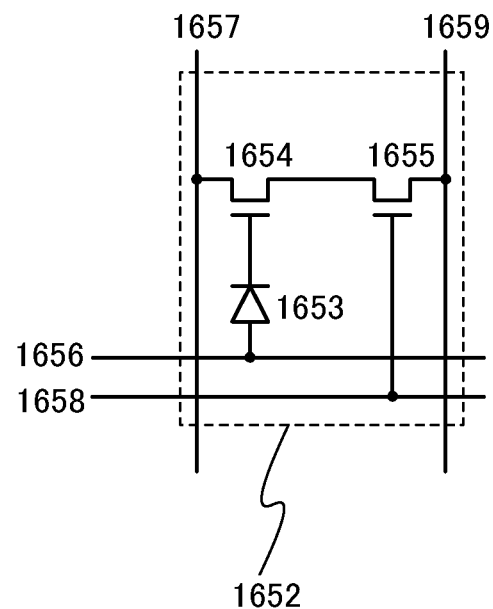
FIG. 16B illustrates a specific example of the photo sensor.

FIG. 16B illustrates an example of the structure of the photo sensor 1652. The photo sensor 1652 illustrated in FIG. 16B includes a photodiode 1653, a transistor 1654, and a transistor 1655. One electrode of the photodiode 1653 is electrically connected to a reset signal line 1656. The other electrode of the photodiode 1653 is electrically connected to a gate of the transistor 1654. One of a source and a drain of the transistor 1654 is connected to a reference signal line 1657. The other of the source and the drain of the transistor 1654 is connected to one of a source and a drain of the transistor 1655. A gate of the transistor 1655 is connected to a gate signal line 1658. The other of the source and the drain of the transistor 1655 is connected to an output signal line 1659.

<Example of Transistor>

Next, the structures of transistors are described with reference to FIGS. 17A to 17D. Here, the structures of n-channel transistors including both microcrystalline semiconductors and amorphous semiconductors in semiconductor layers are described as an example.

FIGS. 17A to 17D are examples of cross-sectional views of transistors. The transistor illustrated in FIG. 17A includes, over a substrate 601, a gate layer 603, a semiconductor layer 633, a gate insulating layer 605 provided between the gate layer 603 and the semiconductor layer 633, impurity semiconductor layers 631a and 631b which are in contact with the semiconductor layer 633 and function as a source region and a drain region, and wirings 629a and 629b which are in contact with the impurity semiconductor layers 631a and 631b. Further, an insulating layer 637 which covers the semiconductor layer 633, the impurity semiconductor layers 631a and 631b, and the wirings 629a and 629b of the transistor is formed.

The semiconductor layer 633 includes a microcrystalline semiconductor region 633a and a pair of amorphous semiconductor regions 633b. The microcrystalline semiconductor region 633a is in contact with the gate insulating layer 605 on a first surface and is in contact with the pair of amorphous semiconductor regions 633b and the insulating layer 637 on a second surface which faces the first surface. The amorphous semiconductor region 633b are obtained by being divided by the insulating layer 637, are in contact with the microcrystalline semiconductor region 633a on a first surface, and are in contact with the pair of impurity semiconductor layers 631a and 631b on a second surface which faces the first surface. In other words, in a region of the semiconductor layer 633 that overlaps with the gate layer 603, the microcrystalline semiconductor region 633a is in contact with the insulating layer 637 and the gate insulating layer 605 which is in contact with the gate layer 603.

Figure 17A:
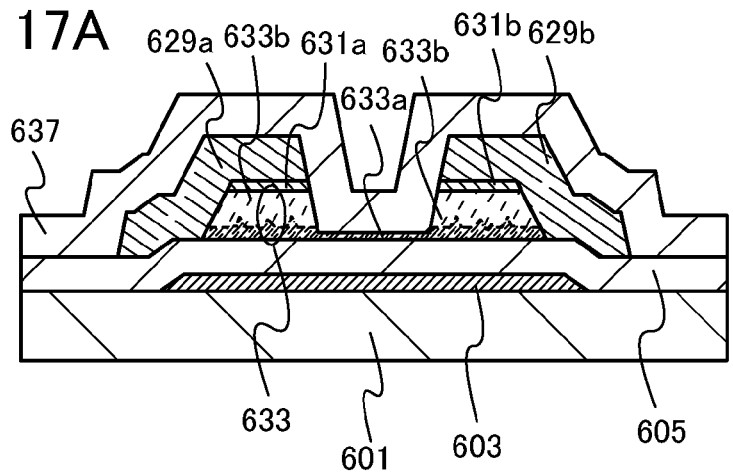
FIGS. 17A and 17B are cross-sectional views illustrating specific examples of transistors.
Figure 17B:
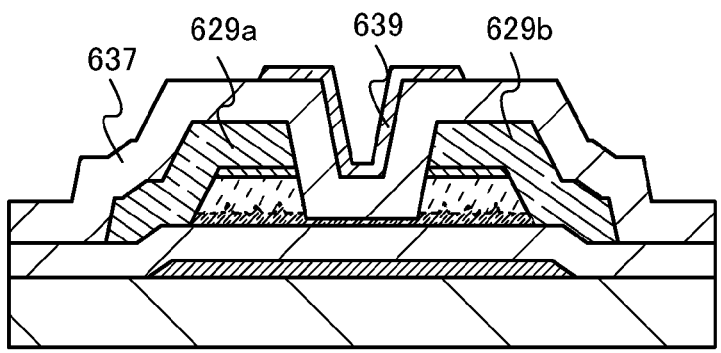

The transistor illustrated in FIG. 17B is a dual-gate transistor, which includes the insulating layer 637 for covering the transistor illustrated in FIG. 17A and an electrode which is provided over the insulating layer 637 and overlaps with the semiconductor layer 633. Note that here, an electrode which faces the semiconductor layer 633 with the insulating layer 637 provided therebetween is denoted by a back gate layer 639.

In the dual-gate transistor, potentials applied to the gate layer 603 and the back gate layer 639 can be different from each other. Thus, the threshold voltage of the transistor can be controlled. Alternatively, the same potential can be applied to the gate layer 603 and the back gate layer 639. Therefore, channels are formed on the first surface and the second surface of the microcrystalline semiconductor region 633a.

In the dual-gate transistor illustrated in FIG. 17B, two channel formation regions are formed in the vicinity of an interface between the microcrystalline semiconductor region 633a and the gate insulating layer 605 and in the vicinity of an interface between the microcrystalline semiconductor region 633a and the insulating layer 637, so that the amount of carrier transfer is increased and on-state current and field-effect mobility can be increased. Therefore, the size of the transistor can be decreased, so that high integration of a driver circuit can be achieved. Accordingly, when the transistor illustrated in FIG. 17B is used in a driver circuit of a liquid crystal display device, the size of the driver circuit can be decreased, so that the frame of the liquid crystal display device can be narrowed.

Next, components of the transistor are described below.

As the substrate 601, a glass substrate, a ceramic substrate, a plastic substrate with heat resistance that can withstand process temperature, or the like can be used. As a glass substrate, for example, an alkali-free glass substrate including barium borosilicate glass, aluminoborosilicate glass, aluminosilicate glass, or the like is preferably used. Further, as the substrate 601, a glass substrate having any of the following sizes can be used: the 3rd generation (e.g., 550 mm×650 mm), the 3.5th generation (e.g., 600 mm×720 mm or 620 mm×750 mm), the 4th generation (e.g., 680 mm×880 mm or 730 mm×920 mm), the 5th generation (e.g., 1100 mm×1300 mm), the 6th generation (e.g., 1500 mm×1800 mm), the 7th generation (e.g., 1900 mm×2200 mm), the 8th generation (e.g., 2160 mm×2460 mm), the 9th generation (e.g., 2400 mm×2800 mm), and the 10th generation (e.g., 2850 mm×3050 mm).

The gate layer 603 can be formed in a single layer or a stacked layer including a metal material such as molybdenum, titanium, chromium, tantalum, tungsten, aluminum, copper, neodymium, scandium, or nickel, or an alloy material which contains any of these materials as a main component. A semiconductor material typified by polycrystalline silicon that is doped with an impurity element such as phosphorus, an AgPdCu alloy, an Al—Nd alloy, an Al—Ni alloy, or the like may be used.

For example, as a two-layer structure of the gate layer 603, a two-layer structure in which a molybdenum layer is stacked over an aluminum layer, a two-layer structure in which a molybdenum layer is stacked over a copper layer, a two-layer structure in which a titanium nitride layer or a tantalum nitride is stacked over a copper layer, a two-layer structure in which a titanium nitride layer and a molybdenum layer are stacked, a two-layer structure in which an alloy layer including copper, magnesium, and oxygen and a copper layer are stacked, a two-layer structure in which alloy layer including copper, manganese, and oxygen and a copper layer are stacked, a two-layer structure in which an alloy layer including copper and manganese and a copper layer are stacked, or the like is preferable. Alternatively, a three-layer structure in which a tungsten layer or a tungsten nitride layer, an alloy layer including aluminum and silicon or an alloy layer including aluminum and titanium, and a titanium nitride layer or a titanium layer are stacked is preferably used. When a metal layer functioning as a barrier layer is stacked over a layer with low electric resistance, electric resistance can be lowered and diffusion of a metal element from the metal layer into the semiconductor layer can be prevented.

The gate insulating layer 605 can be formed in a single layer or a stacked layer including a silicon oxide layer, a silicon nitride layer, a silicon oxynitride layer, or a silicon nitride oxide layer by CVD, sputtering, or the like. Further, when the gate insulating layer 605 is formed using a silicon oxide layer or a silicon oxynitride layer, a fluctuation in the threshold voltage of the transistor can be suppressed.

Note that here, silicon oxynitride means silicon contains more oxygen than nitrogen. In the case where measurements are performed using Rutherford backscattering spectrometry (RBS) and hydrogen forward scattering spectrometry (HFS), silicon oxynitride preferably contains oxygen, nitrogen, silicon, and hydrogen at concentrations ranging from 50 to 70 at. %, 0.5 to 15 at. %, 25 to 35 at. %, and 0.1 to 10 at. %, respectively. Further, silicon nitride oxide contains more nitrogen than oxygen. In the case where measurements are performed using RBS and HFS, silicon nitride oxide preferably contains oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in silicon oxynitride or silicon nitride oxide is defined as 100 at. %.

The semiconductor layer 633 has a structure in which the microcrystalline semiconductor region 633a and the amorphous semiconductor regions 633b are stacked. Further, in this embodiment, the microcrystalline semiconductor region 633a is uneven.

Here, the detailed structure of the semiconductor layer 633 is described. In this embodiment, FIGS. 17C and 17D are enlarged views each illustrating a region between the gate insulating layer 605 and the impurity semiconductor layer 631a which functions as the source region or the drain region in the transistor illustrated in FIG. 17A.

Figure 17C:
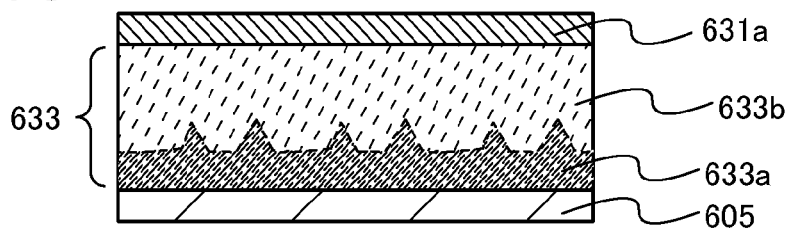
FIGS. 17C and 17D are cross-sectional views illustrating specific examples of semiconductor layers.
Figure 17D:
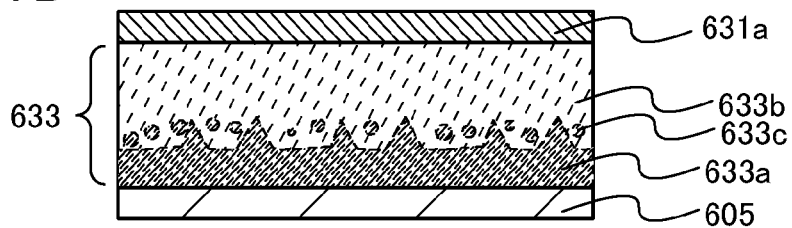

As illustrated in FIG. 17C, the microcrystalline semiconductor region 633a is uneven. A projecting portion has a projecting (conical or pyramidal) shape whose tip is narrowed from the gate insulating layer 605 to the amorphous semiconductor region 633b (i.e., the tip of the projecting portion has an acute angle). Note that the projecting portion may have a projecting (inverted conical or inverted pyramidal) shape whose width is increased from the gate insulating layer 605 to the amorphous semiconductor region 633b.

The microcrystalline semiconductor region 633a includes a microcrystalline semiconductor.

The peak of the Raman spectrum of microcrystalline silicon, which is a typical example of a microcrystalline semiconductor, shifts to a lower wavenumber side than 520 cm$^{-1}$, which represents the peak of the Raman spectrum of single crystal silicon. That is, the peak of the Raman spectrum of microcrystalline silicon is within the range from 520 cm$^{-1}$, which represents single crystal silicon, to 480 cm$^{-1}$, which represents amorphous silicon. In addition, microcrystalline semiconductor contains hydrogen or halogen at a concentration of at least 1 at. % or more to terminate dangling bonds. Further, the microcrystalline semiconductor may contain a rare gas element such as helium, argon, krypton, or neon to further promote lattice distortion, so that stability is increased and a favorable microcrystalline semiconductor can be obtained.

The thickness of the microcrystalline semiconductor region 633a, i.e., the distance from the interface between the microcrystalline semiconductor region 633a and the gate insulating layer 605 to the tip of the projection (the projecting portion) of the microcrystalline semiconductor region 633a is set to 3 to 410 nm, preferably 20 to 100 nm, so that the off-state current of the transistor can be reduced.

Further, it is preferable that the concentration of oxygen and nitrogen contained in the semiconductor layer 633 that is measured by secondary ion mass spectrometry be lower than $1 \times 10^{18}$ atoms/cm$^3$ because the crystallinity of the microcrystalline semiconductor region 633a can be improved.

The amorphous semiconductor region 633b includes an amorphous semiconductor containing nitrogen. Nitrogen of the amorphous semiconductor containing nitrogen may exist, for example, as an NH group or an NH$_2$ group. The amorphous semiconductor is formed using amorphous silicon.

The amorphous semiconductor containing nitrogen is a semiconductor having lower energy at an Urbach edge that is measured by a constant photocurrent method (CPM) or photoluminescence spectroscopy and a smaller amount of defect absorption spectrum, as compared to a conventional amorphous semiconductor. In other words, as compared to the conventional amorphous semiconductor, the amorphous semiconductor containing nitrogen is a well-ordered semiconductor which has few defects and whose tail of a level at a valence band edge is steep. Since the amorphous semiconductor containing nitrogen has a steep tail of a level at a valence band edge, the band gap is wide and tunnel current does not flow easily. Therefore, when the amorphous semiconductor containing nitrogen is provided on the side of the impurity semiconductor layers 631a and 631b, the off-state current of the transistor can be reduced. In addition, by provision of the amorphous semiconductor containing nitrogen, the on-state current and the field-effect mobility can be increased.

Further, the peak region of a spectrum of the amorphous semiconductor containing nitrogen that is measured by low-temperature photoluminescence spectroscopy is 1.31 to 1.39 eV. Note that the peak region of a spectrum of a microcrystalline semiconductor, typically microcrystalline silicon, that is measured by low-temperature photoluminescence spectroscopy is 0.98 to 1.02 eV. Accordingly, the amorphous semiconductor containing nitrogen is different from a microcrystalline semiconductor.

In addition to the amorphous semiconductor region 633b, the microcrystalline semiconductor region 633a may include an NH group or an NH$_2$ group.

Further, as illustrated in FIG. 17D, when semiconductor crystal grains 633c whose grain size is 1 nm to 10 nm, preferably 1 nm to 5 nm are dispersed in the amorphous semiconductor region 633b, the on-state current and the filed-effect mobility can be increased.

The microcrystalline semiconductor region 633a having a projecting (conical or pyramidal) shape whose tip is narrowed from the gate insulating layer 605 to the amorphous semiconductor region 633b or the microcrystalline semiconductor region 633a having a projecting shape whose width is increased from the gate insulating layer 605 to the amorphous semiconductor region 633b can be formed in the following manner: a microcrystalline semiconductor layer is formed under a condition that a microcrystalline semiconductor is deposited, and after that, crystals of the microcrystalline semiconductor layer grow under a condition that crystal growth is suppressed and an amorphous semiconductor is deposited.

Since the microcrystalline semiconductor region 633a in each of the transistors illustrated in FIGS. 17A and 17B has a conical or pyramidal shape or an inverted conical or pyramidal shape, resistance in a vertical direction (a thickness direction), i.e., resistance of the semiconductor layer 633 when the transistor is on and voltage is applied between the source layer and drain layer can be lowered. Further, the amorphous semiconductor containing nitrogen that is a well-ordered semiconductor which has fewer defects and whose tail of a level at a valence band edge is steep is provided between the microcrystalline semiconductor region 633a and the impurity semiconductor layers 631a and 631b; thus, tunnel current does not flow easily. Thus, in each of the transistors illustrated in FIGS. 17A and 17B, the on-state current and the field-effect mobility can be increased and the off-state current can be reduced.

The impurity semiconductor layers 631a and 631b include amorphous silicon to which phosphorus is added, microcrystalline silicon to which phosphorus is added, or the like. Alternatively, the impurity semiconductor layers 631a and 631b can have a layered structure of amorphous silicon to which phosphorus is added and microcrystalline silicon to which phosphorus is added. Note that when a p-channel transistor is formed as the transistor, the impurity semiconductor layers 631a and 631b include microcrystalline silicon to which boron is added, amorphous silicon to which boron is added, or the like. Note that in the case where an ohmic contact is formed between the semiconductor layer 633 and the wirings 629a and 629b, the impurity semiconductor layers 631a and 631b are not necessarily formed.

In the case where the impurity semiconductor layers 631a and 631b include amorphous silicon to which phosphorus is added or microcrystalline silicon to which boron is added, characteristics of the interface can be improved by formation of a microcrystalline semiconductor layer, typically a microcrystalline silicon layer, between the semiconductor layer 633 and the impurity semiconductor layers 631a and 631b. Accordingly, resistance generated at an interface between the impurity semiconductor layers 631a and 631b and the semiconductor layer 633 can be lowered. Thus, the amount of current flowing through the source region, the semiconductor layer, and the drain region of the transistor can be increased and the on-state current and the field-effect mobility can be increased.

The wirings 629a and 629b can be formed in a single layer or a stacked layer of aluminum, copper, titanium, neodymium, scandium, molybdenum, chromium, tantalum, tungsten, or the like. Alternatively, an aluminum alloy to which an element for preventing hillocks is added (e.g., an Al—Nd alloy which can be used for the gate layer 603) may be used. Crystalline silicon to which an impurity element which serves as a donor is added may be used. Further, the wirings 629a and 629b may have a layered structure in which a layer that is in contact with crystalline silicon to which an impurity element serving as a donor is added, is formed using titanium, tantalum, molybdenum, tungsten, or a nitride of any of these elements and aluminum or an aluminum alloy is formed thereover. Alternatively, the wirings 629a and 629b may have a layered structure in which an upper side and a lower side of aluminum or an aluminum alloy are covered with titanium, tantalum, molybdenum, tungsten, or a nitride of any of these elements.

The insulating layer 637 can be formed in a manner similar to that of the gate insulating layer 605. In addition, the insulating layer 637 can be formed using an organic resin layer. As an organic resin layer, for example, acrylic, epoxy, polyimide, polyamide, polyvinylphenol, benzocyclobutene, or the like can be used. Alternatively, a siloxane polymer can be used.

The back gate layer 639 illustrated in FIG. 17B can be formed in a manner similar to that of the wirings 629a and 629b. Further, the back gate layer 639 can be formed using indium oxide including tungsten oxide, indium zinc oxide including tungsten oxide, indium oxide including titanium oxide, indium tin oxide including titanium oxide, indium tin oxide, indium zinc oxide, indium tin oxide to which silicon oxide is added, or the like.

Alternatively, the back gate layer 639 can be formed using a conductive composition including a light-transmitting conductive polymer (also referred to as a conductive polymer). The back gate layer 639 preferably has a sheet resistance of 10000 ohm/square or lower and a transmittance of 70% or higher at a wavelength of 550 nm The sheet resistance of the back gate layer 639 is preferably lower. Further, the resistivity of the conductive polymer included in the conductive composition is preferably 0.1 Ω·cm or lower.

As the conductive polymer, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, or the like can be used.

Note that FIGS. 17A and 17B each illustrate the structure of the transistor in which the semiconductor layer 633 includes the microcrystalline semiconductor region 633a and the amorphous semiconductor region 633b; however, the structure of the transistor included in the liquid crystal display device according to one embodiment of the present invention is not limited to this structure. The semiconductor layer may include only an amorphous semiconductor.

For example, an amorphous semiconductor containing silicon can be obtained by glow discharge decomposition of a gas containing silicon. As a gas containing silicon, $SiH_4$ or $Si_2H_6$ can be used. The gas containing silicon may be diluted with hydrogen or hydrogen and helium. Specifically, a semiconductor layer including an amorphous semiconductor containing silicon can be formed by plasma-enhanced CVD under the following conditions: the flow rates of monosilane and hydrogen are each 25 sccm; the reaction pressure is 40 Pa; the substrate temperature is 250° C.; and a high frequency of 60 MHz is used.

Next, the shape of the back gate layer is described with reference to FIGS. 18A to 18C that are plan views of the transistor.

Figure 18A:
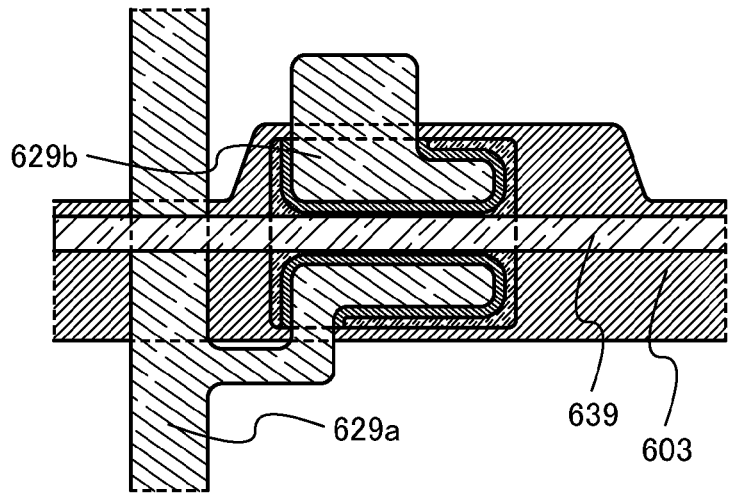
FIGS. 18A to 18C are top views illustrating specific examples of transistors.

As illustrated in FIG. 18A, the back gate layer 639 can be formed parallel to the gate layer 603. In that case, a potential applied to the back gate layer 639 and a potential applied to the gate layer 603 can be controlled in a given way. Thus, the threshold voltage of the transistor can be controlled.

Figure 18B:
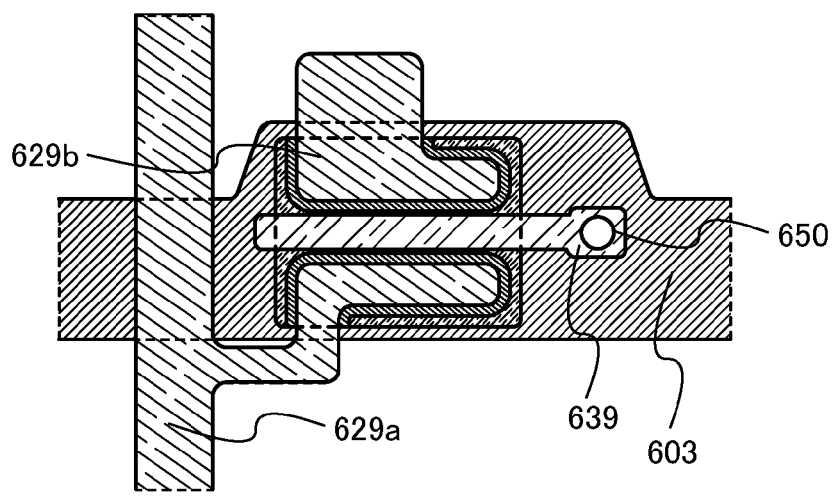

As illustrated in FIG. 18B, the back gate layer 639 can be connected to the gate layer 603. In other words, the gate layer 603 and the back gate layer 639 can be connected to each other through an opening 650 formed in the gate insulating layer 605 and the insulating layer 637. In that case, a potential applied to the back gate layer 639 and a potential applied to the gate layer 603 are equal. Accordingly, in the microcrystalline semiconductor region in the semiconductor layer, regions where carriers flow, i.e., channels are formed on the gate insulating layer 605 side and the insulating layer 637 side. Thus, the on-state current of the transistor can be increased.

Figure 18C:
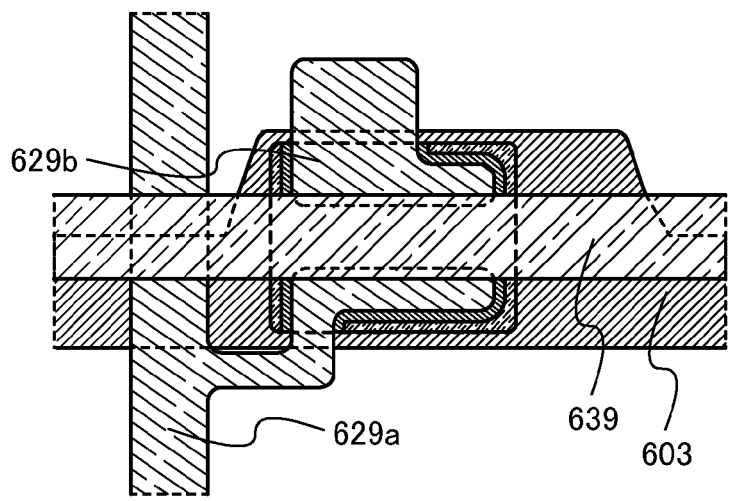

As illustrated in FIG. 18C, the back gate layer 639 may overlap with the wirings 629a and 629b with the insulating layer 637 provided therebetween. Although FIG. 18C illustrates the back gate layer 639 with the structure illustrated in FIG. 18A, the back gate layer 639 illustrated in FIG. 18B may overlap with the wirings 629a and 629b in a similar manner.

Next, transistors including a semiconductor layer with a structure which is different from the semiconductor layer illustrated in FIGS. 17A to 17D are described with reference to FIGS. 19A and 19B.

Figure 19A:
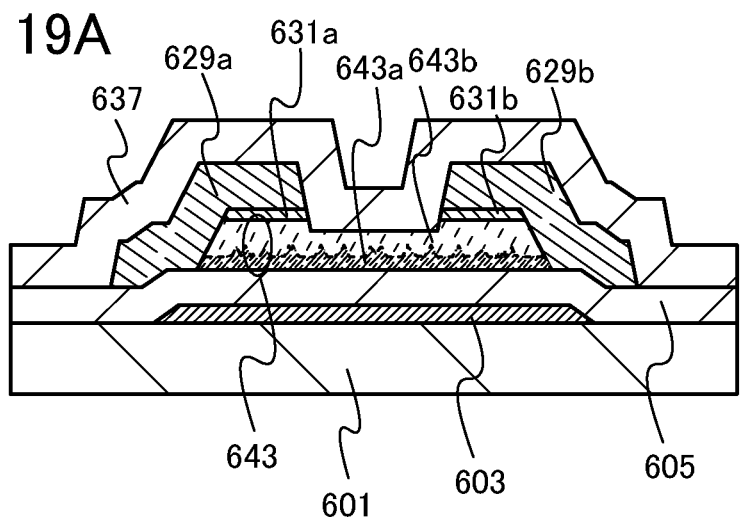
FIGS. 19A and 19B are cross-sectional views illustrating specific examples of transistors.

The transistor illustrated in FIG. 19A includes, over the substrate 601, the gate layer 603, a semiconductor layer 643, the gate insulating layer 605 provided between the gate layer 603 and the semiconductor layer 643, the impurity semiconductor layers 631a and 631b which are in contact with the semiconductor layer 643 and function as a source region and a drain region, and the wirings 629a and 629b which are in contact with the impurity semiconductor layers 631a and 631b. Further, the insulating layer 637 which covers the semiconductor layer 643, the impurity semiconductor layers 631a and 631b, and the wirings 629a and 629b of the transistor is formed.

The semiconductor layer 643 includes a microcrystalline semiconductor region 643a and an amorphous semiconductor region 643b. The microcrystalline semiconductor region 643a is in contact with the gate insulating layer 605 on a first surface and is in contact with the amorphous semiconductor region 643b on a second surface which faces the first surface. The amorphous semiconductor region 643b is in contact with the microcrystalline semiconductor region 643a on a first surface and is in contact with the pair of impurity semiconductor layers 631a and 631b on a second surface which faces the first surface.

Figure 19B:
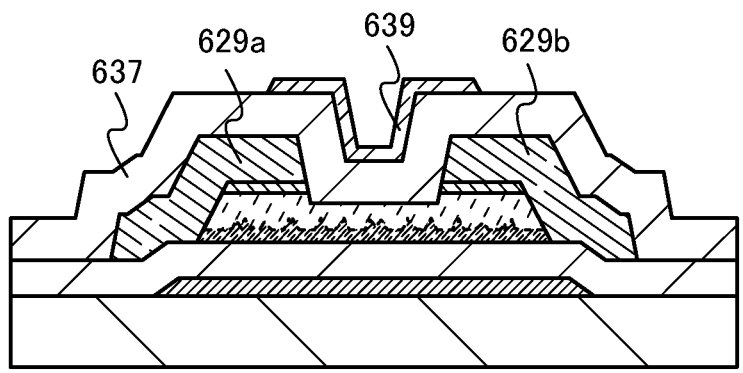

The transistor illustrated in FIG. 19B is a dual-gate transistor, which includes the insulating layer 637 for covering the transistor illustrated in FIG. 19A and the back gate layer 639 which is over the insulating layer 637 and overlaps with the semiconductor layer 643. In other words, in a region of the semiconductor layer 643 that overlaps with the gate layer 603, the microcrystalline semiconductor region 643a is in contact with the gate insulating layer 605 which is in contact with the gate layer 603, and the amorphous semiconductor region 643b is in contact with the insulating layer 637 which is in contact with the back gate layer 639.

The microcrystalline semiconductor region 643a is formed using a material which is similar to that of the microcrystalline semiconductor region 633a illustrated in FIGS. 17A to 17D. The amorphous semiconductor region 643b is formed using a material which is similar to that of the amorphous semiconductor region 633b illustrated in FIGS. 17A to 17D. The transistors illustrated in FIGS. 19A and 19B differ from the transistors illustrated in FIGS. 17A and 17B in that the amorphous semiconductor region 643b is not divided, one surface of the microcrystalline semiconductor region 643a is in contact with the gate insulating layer 605, and the other surface of the microcrystalline semiconductor region 643a is in contact with the amorphous semiconductor region 643b.

The transistors illustrated in FIGS. 19A and 19B include the microcrystalline semiconductor region 643a which is in contact with the gate insulating layer 605, the amorphous semiconductor region 643b containing nitrogen that is formed using a well-ordered semiconductor which has fewer defects and whose tail of a level at a valence band edge is steep and the semiconductor layer 643 which includes the amorphous semiconductor region 643b on the insulating layer 637 side. Thus, the transistors illustrated in FIGS. 19A and 19B has lower off-state current, higher on-state current, and higher field-effect mobility than the transistors illustrated in FIGS. 17A and 17B. Accordingly, when the transistors in FIGS. 19A and 19B are used as transistors provided in pixels in a liquid crystal display device, a liquid crystal display device with high contrast and high image quality can be obtained.

Further, in the transistors illustrated in FIGS. 17A and 17B and the transistors illustrated in FIGS. 19A and 19B, the area of each of the semiconductor layers 633 and 643 may be smaller than that of the gate layer 603 and the whole region of each of the semiconductor layers 633 and 643 may overlap with the gate layer 603. Further, insulating regions that are barrier regions may be provided on side walls of the semiconductor layers 633 and 643, i.e., between the semiconductor layers 633 and 643 and the wirings 629a and 629b. The insulating regions that are barrier regions are formed by nitriding or oxidation of some of the semiconductor layer 633 or 643 and are typically formed using semiconductor nitrides or semiconductor oxides. Examples of semiconductor nitrides include silicon nitride, silicon nitride oxide, and the like, and examples of semiconductor oxides include silicon oxide, silicon oxynitride, and the like. Note that the semiconductor nitrides or the semiconductor oxides included in the insulating regions do not necessarily satisfy stoichiometric proportions.

When the insulating regions that are barrier regions are provided on the side walls of the semiconductor layers 633 and 643, i.e., between the semiconductor layer 633 or 643 and the wirings 629a and 629b, injection of holes from the wirings 629a and 629b into the semiconductor layers 633 and 643 can be suppressed, so that the off-state current of the transistors can be reduced. Thus, a transistor with low light leakage current and low off-state current can be obtained.

<Example of Method for Manufacturing Transistor>

Next, an example of a method for manufacturing a transistor is described. Here, a method for manufacturing the transistor illustrated in FIG. 17B is described with reference to FIGS. 20A to 20C and FIGS. 21A to 21D as an example. In this embodiment, a method for manufacturing an n-channel transistor is described.

Figure 20A:
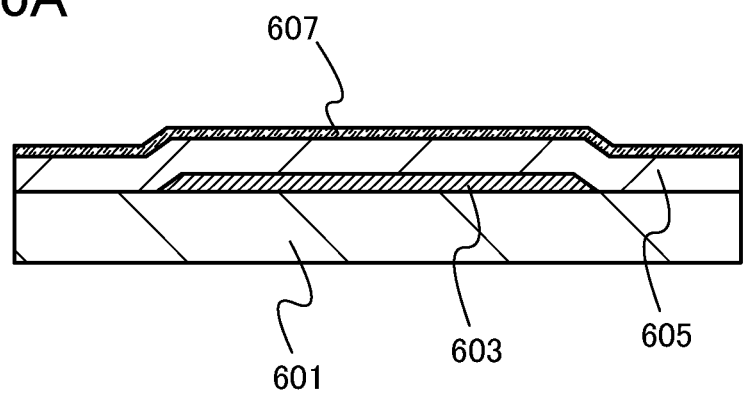
FIGS. 20A to 20C are cross-sectional views illustrating specific examples of steps of manufacturing a transistor.

As illustrated in FIG. 20A, the gate layer 603 is formed over the substrate 601. Then, the gate insulating layer 605 for covering the gate layer 603 and the microcrystalline semiconductor layer 607 are formed.

The gate layer 603 is formed using any of the above materials as appropriate. The gate layer 603 can be formed in such a manner that a conductive layer is formed over the substrate 601 with the use of the above material by sputtering or vacuum evaporation, a mask is formed over the conductive layer by photolithography, an inkjet method, or the like, and the conductive layer is etched using the mask. Alternatively, the gate layer 603 can be formed by discharge of a conductive nanopaste of silver, gold, copper, or the like over the substrate by an inkjet method and baking of the conductive nanopaste. Note that in order to improve adhesion between the gate layer 603 and the substrate 601, a nitride layer of any of the above metal materials may be provided between the substrate 601 and the gate layer 603. Here, a conductive layer is formed over the substrate 601 and is etched with a resist mask formed using a photomask, so that the gate layer 603 is formed.

Note that side surfaces of the gate layer 603 are preferably tapered so that an insulating layer, a semiconductor layer, and a wiring layer which are formed over the gate layer 603 in a later step can be prevented from being broken at step portions. In order that the side surfaces of the gate layer 603 are tapered, etching may be performed while the resist mask is made to recede.

Through the step of forming the gate layer 603, a gate wiring (a scan line) and a capacitor wiring can be formed concurrently. Note that a scan line is a wiring which selects a pixel, and a capacitor wiring is a wiring which is connected to one electrode of a storage capacitor in a pixel. However, this embodiment is not limited to this. The gate layer 603 and either one or both a gate wiring and a capacitor wiring may be formed separately.

The gate insulating layer 605 can be formed using any of the above materials by CVD, sputtering, or the like. In the step of forming the gate insulating layer 605 by CVD, glow discharge plasma is generated by application of high-frequency power of 3 to 30 MHz, typically high-frequency power of 13.56 MHz or 27.12 MHz in the HF band, or high-frequency power of 30 MHz to about 300 MHz in the VHF band, typically 60 MHz. Alternatively, glow discharge plasma is generated by application of high-frequency power with a microwave of 1 GHz or higher. With the use of high-frequency power in the VHF band or with a microwave frequency, the deposition rate can be increased. Note that pulsed oscillation by which high-frequency power is applied in a pulsed manner or continuous oscillation by which high-frequency power is applied continuously can be employed. In addition, by superimposing high-frequency power in the HF band and high-frequency power in the VHF band on each other, unevenness of plasma in a large substrate is reduced, so that uniformity can be improved and the deposition rate can be increased. When the gate insulating layer 605 is formed using a microwave plasma-enhanced CVD apparatus with a frequency of 1 GHz or higher, withstand voltage between the gate layer and a drain and source layers can be improved, so that a highly reliable transistor can be obtained.

Alternatively, when a silicon oxide layer is formed as the gate insulating layer 605 by CVD using an organosilane gas, the crystallinity of a semiconductor layer which is formed later can be improved; thus, the on-state current and field-effect mobility of the transistor can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The microcrystalline semiconductor layer 607 is formed using a microcrystalline semiconductor layer typified by a microcrystalline silicon layer, a microcrystalline silicon-germanium layer, a microcrystalline germanium layer, or the like. The thickness of the microcrystalline semiconductor layer 607 is preferably 3 to 100 nm, more preferably 5 to 50 nm In the case where the microcrystalline semiconductor layer 607 is too thin, the on-state current of the transistor is reduced. In contrast, in the case where the microcrystalline semiconductor layer 607 is too thick, the off-state current of the transistor is increased when the transistor operates at high temperature. For that reason, when the thickness of the microcrystalline semiconductor layer 607 is 3 to 100 nm, preferably 5 to 50 nm, the on-state current and off-state current of the transistor can be controlled.

In a reaction chamber of the plasma-enhanced CVD apparatus, the microcrystalline semiconductor layer 607 is formed by glow discharge plasma with a mixture of hydrogen and a deposition gas containing silicon or germanium. Alternatively, the microcrystalline semiconductor layer 607 is formed by glow discharge plasma with a mixture of a deposition gas including silicon or germanium, hydrogen, and a rare gas such as helium, neon, or krypton. Microcrystalline silicon, microcrystalline silicon-germanium, microcrystalline germanium, or the like is formed using a mixture which is obtained by dilution of the deposition gas containing silicon or germanium with hydrogen whose flow rate is 10 to 2000 times, preferably 10 to 200 times that of the deposition gas. The deposition temperature in that case is preferably room temperature to 300° C., more preferably 200 to 280° C.

Typical examples of the deposition gas containing silicon or germanium include $SiH_4$, $Si_2H_6$, $GeH_4$, $Ge_2H_6$, and the like.

Note that in the case where the gate insulating layer 605 is formed using a silicon nitride layer, an amorphous semiconductor region is likely to be formed at an early stage of deposition of the microcrystalline semiconductor layer 607, so that the crystallinity of the microcrystalline semiconductor layer 607 is low and electric characteristics of the transistor are poor. Therefore, in the case where the gate insulating layer 605 is formed using a silicon nitride layer, the microcrystalline semiconductor layer 607 is preferably deposited under a condition that the dilution rate of the deposition gas containing silicon or germanium is high or under a low temperature condition. Typically, a high dilution rate condition that the flow rate of hydrogen is 200 to 2000 times, more preferably 250 to 400 times that of the deposition gas containing silicon or germanium is preferable. Alternatively, a low temperature condition that temperature for deposition of the microcrystalline semiconductor layer 607 is 200 to 250° C. is preferable. When the high dilution rate condition or the low temperature condition is employed, initial nucleation density is increased, an amorphous component formed over the gate insulating layer 605 is reduced, and the crystallinity of the microcrystalline semiconductor layer 607 is improved. Further, when a surface of the gate insulating layer 605 formed using a silicon nitride layer is oxidized, adhesion with the microcrystalline semiconductor layer 607 is improved. As oxidation treatment, exposure to an oxidizing gas, plasma treatment in an oxidation gas, or the like can be used.

With the use of a rare gas such as helium, argon, neon, krypton, or xenon as a source gas for the microcrystalline semiconductor layer 607, the deposition rate of the microcrystalline semiconductor layer 607 is increased. Further, since the deposition rate is increased, the amount of impurities mixed in the microcrystalline semiconductor layer 607 is reduced; thus, the crystallinity of the microcrystalline semiconductor layer 607 can be improved. Thus, the on-state current and field-effect mobility of the transistor are increased and the throughput of the transistor can be increased.

When the microcrystalline semiconductor layer 607 is formed, glow discharge plasma is generated by application of high-frequency power of 3 to 30 MHz, typically high-frequency power of 13.56 or 27.12 MHz in the HF band, or high-frequency power of 30 MHz to about 300 MHz in the VHF band, typically 60 MHz. Alternatively, glow discharge plasma is generated by application of high-frequency power with a microwave of 1 GHz or higher. Note that pulsed oscillation by which high-frequency power is applied in a pulsed manner or continuous oscillation by which high-frequency power is applied continuously can be employed. In addition, by superimposing high-frequency power in the HF band and high-frequency power in the VHF band on each other, unevenness of plasma in a large substrate is reduced, so that uniformity can be improved and the deposition rate can be increased.

Figure 20B:
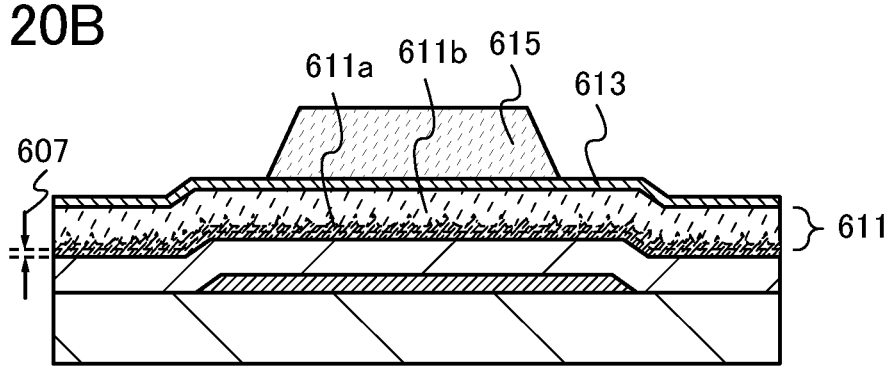
Figure 20C:
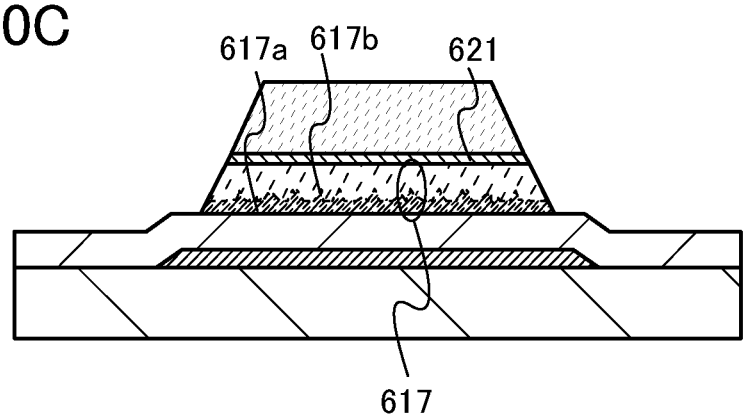

Next, as illustrated in FIG. 20B, a semiconductor layer 611 is formed over the microcrystalline semiconductor layer 607. The semiconductor layer 611 includes a microcrystalline semiconductor region 611a and an amorphous semiconductor region 611b. Next, an impurity semiconductor layer 613 is formed over the semiconductor layer 611. Then, a resist mask 615 is formed over the impurity semiconductor layer 613.

The semiconductor layer 611 including the microcrystalline semiconductor region 611a and the amorphous semiconductor region 611b can be formed under a condition that crystal growth is partly conducted (the crystal growth is suppressed) with the use of the microcrystalline semiconductor layer 607 as a seed crystal.

In the treatment chamber of the plasma-enhanced CVD apparatus, the microcrystalline semiconductor layer 607 is formed by glow discharge plasma with a mixture of hydrogen, a deposition gas containing silicon or germanium, and a gas containing nitrogen. Examples of the gas containing nitrogen include ammonia, nitrogen, nitrogen fluoride, nitrogen chloride, chloroamine, fluoroamine, and the like. Glow discharge plasma can be generated as in the case of the microcrystalline semiconductor layer 607.

In this case, the flow ratio of the deposition gas containing silicon or germanium to hydrogen is the same as that used for forming the microcrystalline semiconductor layer 607, and a gas containing nitrogen is used for the source gas, so that crystal growth can be suppressed as compared to the deposition condition of the microcrystalline semiconductor layer 607. Specifically, since a gas containing nitrogen is included in the source gas, the crystal growth is partly suppressed at an early stage of deposition of the semiconductor layer 611. Thus, a conical or pyramidal microcrystalline semiconductor region grows, and an amorphous semiconductor region is formed. Further, at a middle stage and a later stage of the deposition, crystal growth in the conical or pyramidal microcrystalline semiconductor region stops and only the amorphous semiconductor region is formed. Accordingly, the microcrystalline semiconductor region 611a and the amorphous semiconductor region 611b which is formed with a well-ordered semiconductor layer having fewer defects and a steep tail of a level at a valence band edge can be formed in the semiconductor layer 611.

Here, a typical example of a condition for forming the semiconductor layer 611 is as follows. The flow rate of hydrogen is 10 to 2000 times, preferably 10 to 200 times that of the deposition gas containing silicon or germanium. Note that in a typical example of a condition for forming a normal amorphous semiconductor layer, the flow rate of hydrogen is 0 to 5 times that of the deposition gas containing silicon or germanium.

A rare gas such as helium, neon, argon, krypton, or xenon is introduced into the source gas of the semiconductor layer 611, so that the deposition rate can be increased.

The thickness of the semiconductor layer 611 is preferably 50 to 350 nm, more preferably 120 to 250 nm.

Here, the semiconductor layer 611 including the microcrystalline semiconductor region 611a and the amorphous semiconductor region 611b is formed using a source gas of the semiconductor layer 611, which includes a gas containing nitrogen. Alternatively, the semiconductor layer 611 is formed using a source gas which includes hydrogen and a deposition gas containing silicon or germanium after nitrogen is adsorbed on a surface of the microcrystalline semiconductor layer 607 by exposure of the surface of the microcrystalline semiconductor layer 607 to a gas containing nitrogen. Accordingly, the semiconductor layer 611 including the microcrystalline semiconductor region 611a and the amorphous semiconductor region 611b can be formed.

The impurity semiconductor layer 613 is formed by glow discharge plasma with a mixture of a deposition gas containing silicon, hydrogen, and phosphine (diluted with hydrogen or silane) in the reactive chamber of the plasma-enhanced CVD apparatus. Amorphous silicon to which phosphorus is added or microcrystalline silicon to which phosphorus is added is formed by dilution of the deposition gas including silicon with hydrogen. Note that in the case where a p-channel transistor is formed, the impurity semiconductor layer 613 may be formed by glow discharge plasma with the use of diborane instead of phosphine.

The resist mask 615 can be formed through a photolithography process.

Next, the microcrystalline semiconductor layer 607, the semiconductor layer 611, and the impurity semiconductor layer 613 are etched using the resist mask 615. Through this step, the microcrystalline semiconductor layer 607, the semiconductor layer 611, and the impurity semiconductor layer 613 are divided for each element so that a semiconductor layer 617 and an impurity semiconductor layer 621 are formed. Note that the semiconductor layer 617 is part of the microcrystalline semiconductor layer 607 and part of the semiconductor layer 611 and includes a microcrystalline semiconductor region 617a and an amorphous semiconductor region 617b (see FIG. 20C).

Then, plasma may be generated in an oxidation gas atmosphere or a nitriding gas atmosphere while the resist mask 615 is left so that the semiconductor layer 617 is exposed to the plasma. Generation of plasma in the oxidation gas atmosphere or the nitriding gas atmosphere causes an oxygen radical or a nitrogen radical to be generated. The radical reacts with the semiconductor layer 617, which forms an insulating region serving as a barrier region on a side surface of the semiconductor layer 617.

Figure 21A:
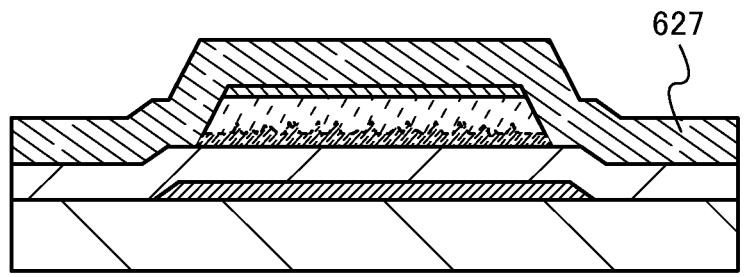
FIGS. 21A to 21D are cross-sectional views illustrating specific examples of steps of manufacturing the transistor.

Next, a conductive layer 627 is formed over the impurity semiconductor layer 621 (see FIG. 21A). The conductive layer 627 can be formed using a material which is similar to that of the wirings 629a and 629b illustrated in FIGS. 17A to 17D, FIGS. 18A to 18C, and FIGS. 19A and 19B as appropriate. The conductive layer 627 is formed by CVD, sputtering, or vacuum evaporation. Alternatively, the conductive layer 627 may be formed by discharge of a conductive nanopaste of silver, gold, copper, or the like by a screen printing method, an inkjet method, or the like and baking of the conductive nanopaste.

Figure 21B:
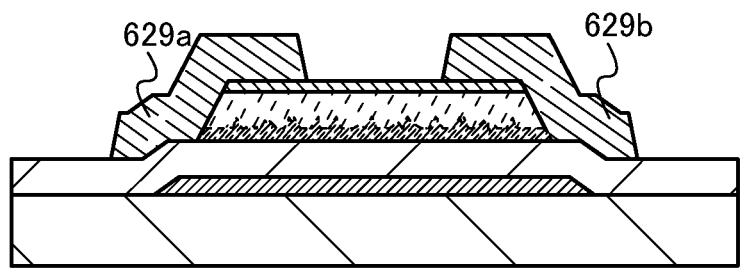

Then, a resist mask is formed through a photolithography process, and the conductive layer 627 is etched using the resist mask, so that the wirings 629a and 629b functioning as a source layer and a drain layer are formed (see FIG. 21B). The conductive layer 627 can be etched by dry etching or wet etching. Note that one of the wirings 629a and 629b functions not only as the source layer and the drain layer but also as a signal line. However, this embodiment is not limited to this. A signal line may be provided separately from the source layer and the drain layer.

Then, the impurity semiconductor layer 621 and the semiconductor layer 617 are partly etched, so that the pair of the impurity semiconductor layers 631a and 631b functioning as a source region and a drain regions are formed. In addition, the semiconductor layer 633 including the microcrystalline semiconductor region 633a and the pair of amorphous semiconductor regions 633b is formed. At this time, the semiconductor layer 617 is etched so that the microcrystalline semiconductor region 633a is exposed, whereby the semiconductor layer 633 has the following structure. In regions which are covered with the wirings 629a and 629b, the microcrystalline semiconductor region 633a and the amorphous semiconductor region 633b are stacked, and in a region which is not covered with the wirings 629a and 629b but overlaps with the gate layer 603, the microcrystalline semiconductor region 633a is exposed (see FIG. 21C).

Since dry etching is used in the etching here, ends of the wirings 629a and 629b are aligned with ends of the impurity semiconductor layers 631a and 631b. However, when the conductive layer 627 is etched by wet etching and the impurity semiconductor layer 621 is etched by dry etching, the ends of the wirings 629a and 629b are not aligned with the ends of the impurity semiconductor layers 631a and 631b. In a cross section in such a case, the ends of the wirings 629a and 629b are positioned on the inner side than the ends of the impurity semiconductor layers 631a and 631b.

Next, dry etching may be performed. The condition of dry etching is set so that exposed regions of the microcrystalline semiconductor region 633a and the amorphous semiconductor region 633b are not damaged and the etching rates of the microcrystalline semiconductor region 633a and the amorphous semiconductor region 633b are low. In other words, a condition that almost no damage is given to exposed surfaces of the microcrystalline semiconductor region 633a and the amorphous semiconductor region 633b and the thicknesses of the exposed regions of microcrystalline semiconductor region 633a and the exposed amorphous semiconductor region 633b are hardly reduced. As an etching gas, $Cl_2$, $CF_4$, $N_2$, or the like is typically used. There is no particular limitation on etching, and inductively coupled plasma (ICP) etching, capacitively coupled plasma (CCP) etching, electron cyclotron resonance (ECR) etching, reactive ion etching (RIE) etching, or the like can be used.

As described above, after the microcrystalline semiconductor region 633a and the amorphous semiconductor region 633b are formed, dry etching is additionally performed under a condition that the microcrystalline semiconductor region 633a and the amorphous semiconductor region 633b are not damaged, so that an impurity such as a residue existing on the exposed regions of the microcrystalline semiconductor region 633a and the amorphous semiconductor region 633b can be removed.

Next, the surfaces of the microcrystalline semiconductor region 633a and the amorphous semiconductor region 633b may be subjected to plasma treatment, typically, water plasma treatment, oxygen plasma treatment, ammonia plasma treatment, nitrogen plasma treatment, or the like.

The water plasma treatment can be performed in such a manner that a gas containing water as a main component that is typified by water vapor ($H_2O$ vapor) is introduced into a reaction space so that plasma is generated. Then, the resist mask is removed. Note that the resist mask may be removed before the dry etching.

As described above, when the water plasma treatment is successively performed after the dry etching, a residue of the resist mask can be removed. By the plasma treatment, insulation between the source region and the drain region can be secured, so that in a transistor which is completed, off-state current can be reduced and variations in electric characteristics can be suppressed.

Through the above steps, a transistor including a channel formation region formed using a microcrystalline semiconductor layer as illustrated in FIG. 17A can be formed. Further, a transistor with low off-state current, high on-state current, and high field-effect mobility can be formed with high productivity.

Next, the insulating layer 637 is formed. The insulating layer 637 can be formed in a manner similar to that of the gate insulating layer 605.

Figure 21C:
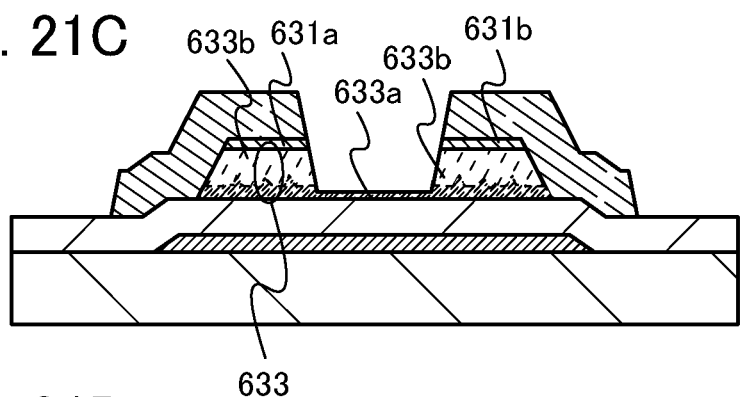
Figure 21D:
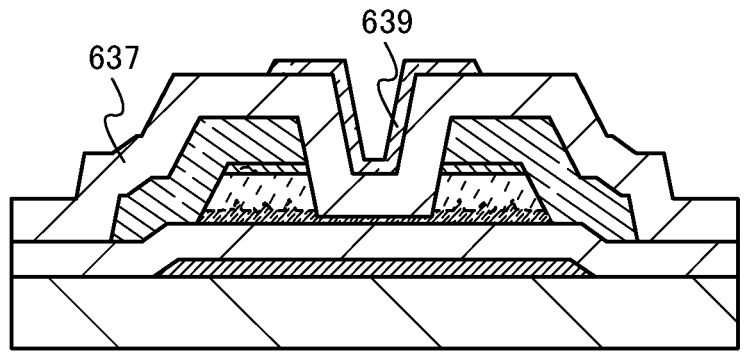

Then, an opening is formed in the insulating layer 637 with the use of a resist mask formed through a photolithography process, and then, the back gate layer 639 is formed (see FIG. 21D).

The back gate layer 639 can be formed in such a manner that a thin film is formed using any of the above materials by sputtering and is etched using a resist mask which is formed through a photolithography process. Alternatively, the back gate layer 639 can be formed by application or printing of a light-transmitting conductive composition including a conductive polymer and baking of the conductive composition.

Through the above steps, a dual-gate transistor as illustrated in FIG. 17B can be formed.

Note that when the amount of etching of the semiconductor layer 617 and the impurity semiconductor layer 621 in FIG. 21C is controlled, the transistors illustrated in FIGS. 19A and 19B can be formed.

<Various Kinds of Electronic Devices Including Liquid Crystal Display Device>

Examples of electronic devices each including the liquid crystal display device disclosed in this specification are described below with reference to FIGS. 22A to 22F.

Figure 22A:
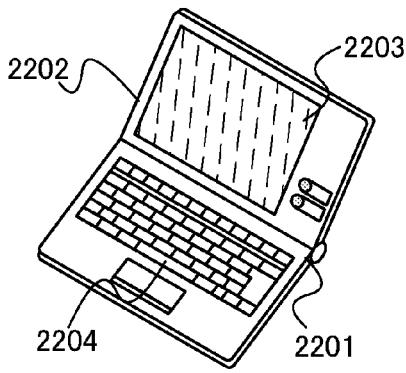
FIGS. 22A to 22F illustrate examples of electronic devices.

FIG. 22A illustrates a laptop personal computer, which includes a main body 2201, a housing 2202, a display portion 2203, a keyboard 2204, and the like.

Figure 22B:
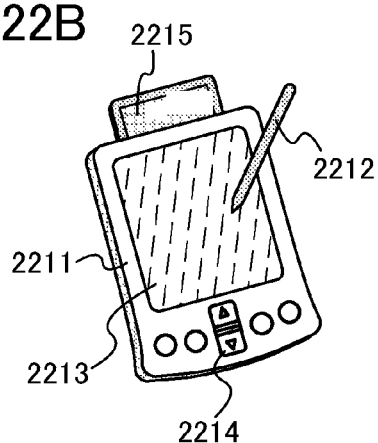

FIG. 22B illustrates a portable information terminal (PDA), which includes a main body 2211 provided with a display portion 2213, an external interface 2215, operation buttons 2214, and the like. Further, a stylus 2212 for operation is included as an accessory.

Figure 22C:
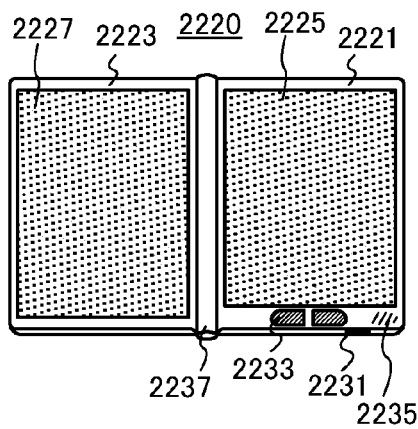

FIG. 22C illustrates an e-book reader 2220 as an example of electronic paper. The e-book reader 2220 includes two housings 2221 and 2223. The housings 2221 and 2223 are combined with each other with a hinge 2237 so that the e-book reader 2220 can be opened and closed with the hinge 2237 used as an axis. With such a structure, the e-book reader 2220 can be used like a paper book.

A display portion 2225 is incorporated in the housing 2221, and a display portion 2227 is incorporated in the housing 2223. The display portions 2225 and 2227 may display one image or different images. In the case where the display portions 2225 and 2227 display different images, for example, a display portion on the right side (the display portion 2225 in FIG. 22C) can display text and a display portion on the left side (the display portion 2227 in FIG. 22C) can display images.

Further, in FIG. 22C, the housing 2221 includes an operation portion and the like. For example, the housing 2221 includes a power button 2231, operation keys 2233, a speaker 2235, and the like. With the operation key 2233, pages can be turned. Note that a keyboard, a pointing device, or the like may be provided on the same surface as the display portion of the housing. Further, an external connection terminal (e.g., an earphone terminal, a USB terminal, or a terminal which can be connected to an AC adapter or a variety of cables such as USB cables), a recording medium insertion portion, or the like may be provided on a back surface or a side surface of the housing. Furthermore, the e-book reader 2220 may function as an electronic dictionary.

The e-book reader 2220 may transmit and receive data wirelessly. Through wireless communication, desired book data or the like can be purchased and downloaded from an electronic book server.

Note that electronic paper can be applied to devices in a variety of fields as long as they display information. For example, electronic paper can be used for posters, advertisement in vehicles such as trains, display in a variety of cards such as credit cards, and the like in addition to e-book readers.

Figure 22D:
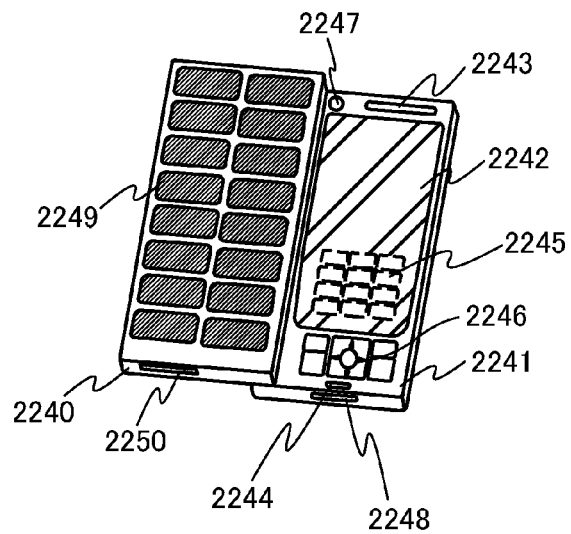

FIG. 22D illustrates a cellular phone. The cellular phone includes two housings 2240 and 2241. The housing 2241 includes a display panel 2242, a speaker 2243, a microphone 2244, a pointing device 2246, a camera lens 2247, an external connection terminal 2248, and the like. The housing 2240 includes a solar cell 2249 for storing electricity in the cellular phone, an external memory slot 2250, and the like. Further, an antenna is incorporated in the housing 2241.

The display panel 2242 has a touch panel function. A plurality of operation keys 2245 which are displayed as images are indicated by dashed lines in FIG. 22D. Note that the cellular phone includes a DC-DC converter for raising voltage output from the solar cell 2249 to voltage needed for each circuit. Further, the cellular phone can include a contactless IC chip, a small recording device, or the like in addition to the above components.

The display direction of the display panel 2242 is changed as appropriate in accordance with applications. Further, the camera lens 2247 is provided on the same surface as the display panel 2242; thus, the cellular phone can be used as a video phone. The speaker 2243 and the microphone 2244 can be used for videophone calls, recording, and playing sound, and the like as well as voice calls. Furthermore, the housings 2240 and 2241 which are developed as illustrated in FIG. 22D can overlap with each other by sliding; thus, the size of the cellular phone can be decreased, which makes the cellular phone suitable for being carried.

The external connection terminal 2248 can be connected to an AC adapter or a variety of cables such as USB cables, so that electricity can be stored and data communication can be performed. In addition, a larger amount of data can be saved and moved by insertion of a recording medium in the external memory slot 2250. Further, in addition to the above functions, the cellular phone may have an infrared communication function, a television reception function, or the like.

Figure 22E:
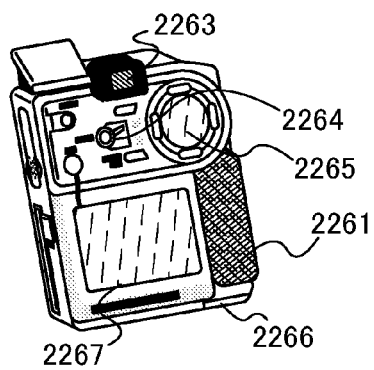

FIG. 22E illustrates a digital camera. The digital camera includes a main body 2261, a first display portion 2267, an eyepiece portion 2263, an operation switch 2264, a second display portion 2265, a battery 2266, and the like.

Figure 22F:
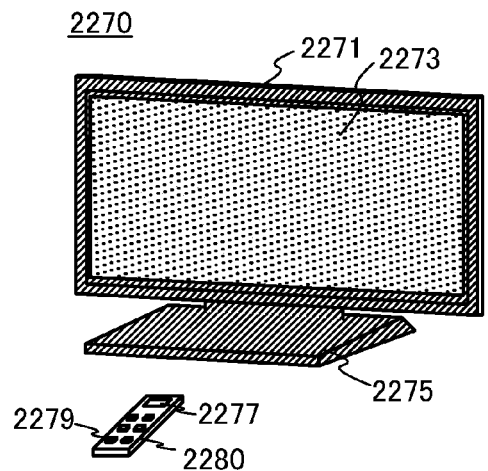

FIG. 22F illustrates a television set. A television set 2270 includes a display portion 2273 incorporated in a housing 2271. The display portion 2273 can display images. Note that here, the housing 2271 is supported by a stand 2275.

The television set 2270 can be operated by an operation switch of the housing 2271 or a remote control 2280. Channels and volume can be controlled with operation keys 2279 of the remote control 2280, so that an image displayed on the display portion 2273 can be controlled. Further, the remote control 2280 may have a display portion 2277 for displaying data output from the remote control 2280.

Note that the television set 2270 preferably includes a receiver, a modem, and the like. A general television broadcast can be received with the receiver. Further, when the television set is connected to a communication network with or without wires via the modem, one-way (from a transmitter to a receiver) or two-way (between a transmitter and a receiver or between receivers) data communication can be performed.

This application is based on Japanese Patent Application serial No. 2010-090934 and Japanese Patent Application serial No. 2010-090936 filed with Japan Patent Office on Apr. 9, 2010 and Japanese Patent Application serial No. 2010-114429 and Japanese Patent Application serial No. 2010-114431 filed with Japan Patent Office on May 18, 2010, the entire contents of which are hereby incorporated by reference.

What is claimed is:

1. A display device comprising:
a first pixel including a first transistor, a second transistor, and a first display element;
a second pixel including a third transistor, a fourth transistor, and a second display element;
a first shift register electrically connected to a first scan line and a third scan line; and
a second shift register electrically connected to a second scan line and a fourth scan line,
wherein a gate of the first transistor is electrically connected to the first scan line, and one of a source and a drain of the first transistor is electrically connected to a first signal line,
wherein a gate of the second transistor is electrically connected to the second scan line, and one of a source and a drain of the second transistor is electrically connected to a second signal line,
wherein one electrode of the first display element is electrically connected to the other of the source and the drain of the first transistor and the other of the source and the drain of the second transistor without passing through an insulator,
wherein a gate of the third transistor is electrically connected to the third scan line, and one of a source and a drain of the third transistor is electrically connected to the first signal line,
wherein a gate of the fourth transistor is electrically connected to the fourth scan line, and one of a source and a drain of the fourth transistor is electrically connected to the second signal line,
wherein one electrode of the second display element is electrically connected to the other of the source and the drain of the third transistor and the other of the source and the drain of the fourth transistor without passing through the insulator, and
wherein each of channel formation regions of the first to fourth transistors includes an amorphous semiconductor or a microcrystalline semiconductor.

2. The display device according to claim 1, wherein the first shift register and the second shift register include a transistor including a microcrystalline semiconductor in a channel formation region.

3. The display device according to claim 1, wherein each of the first display element and the second display element is a liquid crystal element.

4. The display device according to claim 1,
wherein a first image signal is configured to be supplied from the first signal line in a first horizontal scan period included in a first period,
wherein a second image signal is configured to be supplied from the first signal line in a second horizontal scan period included in a second period,
wherein a third image signal is configured to be supplied from the second signal line in the first horizontal scan period included in the first period,
wherein a fourth image signal is configured to be supplied from the second signal line in the second horizontal scan period included in the second period,
wherein the first image signal and the second image signal are image signals for controlling transmission of light having a first color,
wherein the third image signal and the fourth image signal are image signals for controlling transmission of light having a second color, and
wherein the first color and the second color are different from each other.

5. The display device according to claim 4,
wherein a selection signal is configured to be supplied to the first scan line and the fourth scan line from the first shift register and the second shift register in the first horizontal scan period included in the first period,
wherein a non-selection signal is configured to be supplied to the second scan line and the third scan line from the second shift register and the first shift register in the first horizontal scan period included in the first period,
wherein a selection signal is configured to be supplied to the second scan line and the third scan line from the second shift register and the first shift register in the second horizontal scan period included in the second period, and
wherein a non-selection signal is configured to be supplied to the first scan line and the fourth scan line from the first shift register and the second shift register in the second horizontal scan period included in the second period.

6. The display device according to claim 1, further comprising a plurality of backlight units configured to independently emit first light, second light, and third light which are different colors from each other.

7. The display device according to claim 6, wherein the plurality of backlight units is configured to supply at least the first light and the second light to different regions concurrently.

8. The display device according to claim 1, further comprising a capacitor in the first pixel, wherein one terminal of the capacitor is electrically connected to the one electrode of the first display element.

9. A method for driving a display device comprising a transistor including an amorphous semiconductor or a microcrystalline semiconductor in a channel formation region in pixels, comprising the steps of:
sequentially inputting an image signal to pixels provided in a first row to a k-th row for controlling transmission of light having a first color while sequentially inputting an image signal to pixels provided in a (n+1)th row to a (n+k)th row for controlling transmission of light having a second color, in a first period;
after the first period, sequentially inputting an image signal to pixels provided in a (k+1)th row to a 2k-th row for controlling transmission of light having the first color while sequentially inputting an image signal to pixels provided in a (n+k+1)th row to a (n+2k)th row for controlling transmission of light having the second color, in a second period;
after the first period, emitting light having the first color from light sources to pixels provided in the first row to the k-th row while emitting light having the second color from light sources to pixels provided in the (n+1)th row to the (n+k)th row, in a third period; and,
after the second period, emitting light having the first color from light sources to pixels provided in the (k+1)th row to the 2k-th row while emitting light having the second color from light sources to pixels provided in the (n+k+1)th row to the (n+2k)th row, in a fourth period,
wherein a part of the third period is overlapped with a part of the fourth period,
wherein n is a natural number that is 3 or more, and
wherein k is a natural number that is 2 or more and less than n.

10. The method for driving a display device according to claim 9,
wherein a part of the second period is overlapped with a part of the third period.

11. The method for driving a display device according to claim 9,
wherein the first color is white, cyan, magenta, or yellow.

* * * * *